United States Patent
Bhushan et al.

(10) Patent No.: US 8,578,322 B2
(45) Date of Patent: Nov. 5, 2013

(54) METHOD AND APPARATUS FOR AMS SIMULATION OF INTEGRATED CIRCUIT DESIGN

(75) Inventors: Pranav Bhushan, San Jose, CA (US); Chandrashekar L. Chetput, San Jose, CA (US); Timothy Martin O'Leary, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/439,469

(22) Filed: Apr. 4, 2012

(65) Prior Publication Data

US 2012/0198411 A1  Aug. 2, 2012

Related U.S. Application Data

(62) Division of application No. 12/399,855, filed on Mar. 6, 2009, now Pat. No. 8,201,137.

(51) Int. Cl.
*G06F 17/50* (2006.01)

(52) U.S. Cl.
USPC ........... 716/139; 716/100; 716/105; 716/106; 716/110; 716/111; 716/124; 716/132; 716/136

(58) Field of Classification Search
USPC ......... 716/100, 105, 106, 110, 111, 124, 132, 716/136, 139; 703/2, 14
See application file for complete search history.

(56) References Cited

U.S. PATENT DOCUMENTS

| | | | | |
|---|---|---|---|---|
| 4,792,913 A * | 12/1988 | Buckland et al. | | 708/3 |
| 5,136,528 A * | 8/1992 | Fordham et al. | | 703/6 |
| 5,991,522 A * | 11/1999 | Shoen | | 716/103 |
| 6,212,490 B1 * | 4/2001 | Li et al. | | 703/14 |
| 6,460,172 B1 * | 10/2002 | Insenser Farre et al. | | 326/38 |
| 6,505,341 B1 * | 1/2003 | Harris et al. | | 717/100 |
| 6,629,310 B1 * | 9/2003 | Wong-Lam et al. | | 716/117 |
| 6,715,132 B1 * | 3/2004 | Bartz et al. | | 716/100 |
| 6,823,497 B2 * | 11/2004 | Schubert et al. | | 716/106 |
| 6,978,435 B2 * | 12/2005 | Anderson et al. | | 716/117 |
| 6,986,113 B2 * | 1/2006 | Sinha et al. | | 716/115 |
| 7,000,214 B2 * | 2/2006 | Iadanza et al. | | 716/104 |
| 7,024,346 B1 * | 4/2006 | Allard | | 703/14 |
| 7,024,660 B2 * | 4/2006 | Andrade et al. | | 717/124 |
| 7,367,006 B1 * | 4/2008 | O'Riordan et al. | | 716/102 |
| 7,506,286 B2 * | 3/2009 | Beardslee et al. | | 716/136 |

(Continued)

OTHER PUBLICATIONS

"U.S. Appl. No. 12/399,855, 312 Amendment filed Apr. 26, 2012", 10 pgs.

(Continued)

*Primary Examiner* — Helen Rossoshek
(74) *Attorney, Agent, or Firm* — Kenyon & Kenyon LLP

(57) ABSTRACT

A method to create an integrated circuit that includes digital and analog components comprising: displaying on a computer system display, user input to the computer system that specifies parameter information to determine a binding between an analog circuit design component and a digital circuit design component; saving the user specified parameter information within a file that also specifies at least a portion of the analog circuit design; associating the analog circuit design component a first design block of an integrated circuit that also includes a second digital design block coupled to the first design block; using parameter information to determine a binding between the first analog circuit design component and the first digital circuit design component; saving the determined binding in computer readable storage media.

6 Claims, 17 Drawing Sheets

(56) References Cited

U.S. PATENT DOCUMENTS

| | | | |
|---|---|---|---|
| 7,516,423 B2* | 4/2009 | De Smedt et al. | 716/132 |
| 7,523,424 B2* | 4/2009 | Kolpekwar et al. | 716/103 |
| 7,539,602 B2* | 5/2009 | Willis | 703/2 |
| 7,599,821 B1* | 10/2009 | Hou et al. | 703/2 |
| 7,676,403 B2* | 3/2010 | Crutchfield et al. | 705/26.1 |
| 7,797,659 B2* | 9/2010 | Chetput et al. | 716/136 |
| 7,827,510 B1* | 11/2010 | Schubert et al. | 716/136 |
| 7,836,416 B2* | 11/2010 | Schubert et al. | 716/106 |
| 7,865,850 B1* | 1/2011 | Kao et al. | 716/136 |
| 7,937,683 B1* | 5/2011 | Herbst | 716/138 |
| 8,024,678 B1* | 9/2011 | Taylor et al. | 716/100 |
| 8,046,201 B1* | 10/2011 | Pike et al. | 703/6 |
| 8,069,405 B1* | 11/2011 | Bartz et al. | 715/205 |
| 8,069,428 B1* | 11/2011 | Ogami et al. | 716/117 |
| 8,176,296 B2* | 5/2012 | Snyder | 712/32 |
| 8,195,439 B1* | 6/2012 | Hussain | 703/14 |
| 8,234,617 B2* | 7/2012 | Chetput et al. | 716/136 |
| 8,286,112 B2* | 10/2012 | Miranda et al. | 716/110 |
| 2002/0049576 A1* | 4/2002 | Meyer | 703/14 |
| 2005/0143968 A9* | 6/2005 | Odom et al. | 703/21 |
| 2007/0101302 A1* | 5/2007 | Okamoto | 716/4 |
| 2009/0094570 A1* | 4/2009 | Artyomov et al. | 716/12 |
| 2010/0169848 A1* | 7/2010 | Nahmanny et al. | 716/3 |
| 2010/0306722 A1* | 12/2010 | LeHoty et al. | 716/5 |
| 2010/0306729 A1* | 12/2010 | Ginetti | 716/124 |
| 2011/0083114 A1* | 4/2011 | Chetput et al. | 716/106 |
| 2011/0248318 A1* | 10/2011 | Herbst | 257/208 |
| 2012/0198405 A1 | 8/2012 | Bhushan et al. | |

OTHER PUBLICATIONS

"U.S. Appl. No. 12/399,855, Response filed Dec. 6, 2011 to Non Final Office Action mailed Aug. 24, 2011", 11 pgs.

"U.S. Appl. No. 13/439,583, Non Final Office Action mailed Aug. 15, 2012", 10 pgs.

"U.S. Appl. No. 13/439,583, Notice of Allowance mailed Jan. 9, 2013", 10 pgs.

"U.S. Appl. No. 13/439,583, Preliminary Amendment filed Apr. 4, 2012", 3 pgs.

"U.S. Appl. No. 13/439,583, Response filed Nov. 16, 2012 to Non-Final Office Action mailed Aug. 15, 2012", 14 pgs.

* cited by examiner

```
include "<analog_sources>" // SPICE source includes
include "<spice_models>" // SPICE models amsd {
portmap <subckt=top> // info on portmapping between SPICE & Verilog
config <inst=top.I1 use=spice> // cell/inst config info for spice/hdl/stubs
ie <vsup=1.8> // interface elements for custom connect rules
}

// Spectre controls, e.g. analyses, simulator options
tranOpts tran < stop=1n>

// UltraSim(fastSPICE) controls, e.g. sim_mode, speed
*ultrasim: .usim_opt <sim_mode=a speed=5>
```

FIG. 1

```
include "pll.sp"
amsd {
portmap subckt=pll autobus=yes
}
```

FIG. 2

```
amsd {
config inst=top.mid.I1 use=spice    // path specification for I1 as spice
config cell="divider counter" use=hdl    // spice-in-middle, cells counter/divider
}
```

FIG. 3

```
amsd {
    ie vsup= 1.8 // global supply voltage
    ie vsup=2.4 inst=testbench.vlog_buf tr=0.002 // scoped inst specification
}
```

FIG. 4

```
simulator lang=spice
.param temp=27
.param tnom=27
.param VDD=3.3
.param trise=1.2
.include "analog_top_a.scs"
.include "spice_models.scs"

simulator lang=spectre amsd {
  portmap subckt=analog_top_a autobus=yes
  config inst=top.I1 use=spice
  ie vsup=VDD tr=trise*0.01
}

V1 p 0 vsource type=dc dc=VDD
```

FIG. 5

```
include "analog_top_1.cir"
amsd {
config cell="analog_top_a analog_top_b analog_top_c analog_top_d" use=spice
ie vsup=1.8
}
```

FIG. 7

```
include "analog_top.cir"
amsd {
config cell=analog_top use=spice      // spice-subckt
config cell=digital_leaf use=hdl      // spice-in-middle, HDL cell
}
```

FIG. 8

```
include "analog_top.cir"
amsd {
    portmap stub=analog_block match=spice       // spice stub
    config inst=top.analog_block1 use=stub
    config inst=top.xanalog_block2 use=spice    // spice subckt
    portmap stub=worklib.digital_block:module match=verilog    // verilog stub
    config inst=top.digital_block3 use=stub
}
```

FIG. 9

```
amsd {
ie vsup= 1.8          // global supply voltage
ie vsup=2.4 inst=testbench.vlog_buf tr=0.0002   // scoped inst specification
ie vsup=3.3 instport=top.I1.in tr=0.4n
ie vsup=3.3 cellport=mid.w1 vtlo=0.7 vthi=1.5
}
```

FIG. 10

```
// example for Figure 10a
include "analog_top.cir"
amsd {
portmap subckt=analog_top busdelim="[ ]" portcase=lower
config cell=analog_top use=spice
}
```

FIG. 10A

```
include "cell1.sp"
amsd {
          portmap subckt=cell1 reffile="cell1.v"
          config cell=cell1 use=spice
          ie vsup=1.8
}
```
FIG. 15
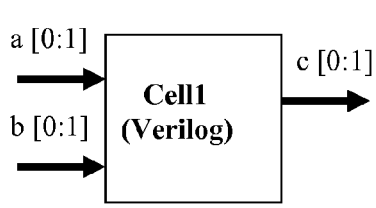
FIG. 16A
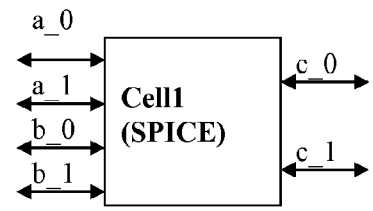
FIG. 16B
```
//* Portbind file for:
//* SPICE subckt cell1  :  Verilog module cell1
{a_0, a_1} : a[0:1]    dir=input
{b_0, b_1} : b[0:1]    dir=input
{c_0, c_1} : c[0:1]    dir=output
```
FIG. 17
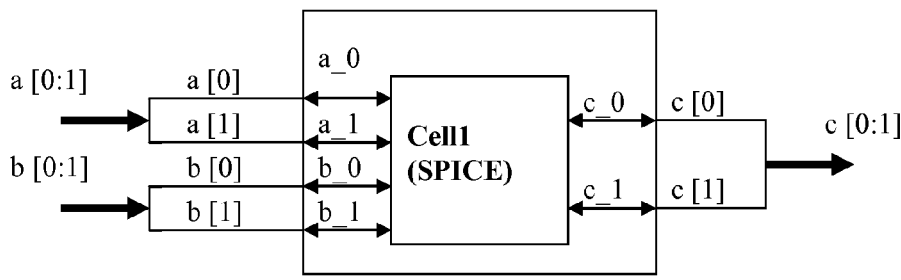
FIG. 18

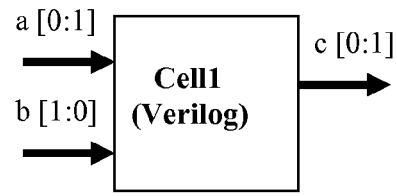
FIG. 19
```
//* Portbind file for:
//* SPICE subckt cell1  :  Verilog module cell1
{a_0, a_1} : a[0:1]    dir=input
{b_0, b_1} : b[1:0]    dir=input
{c_0, c_1} : c[0:1]    dir=output
```
FIG. 20
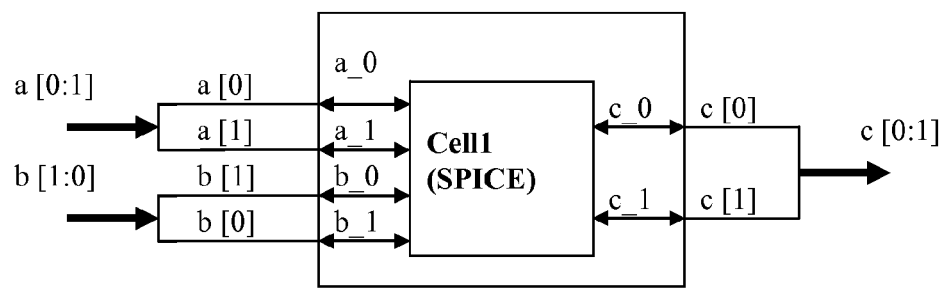
FIG. 21

```
include "cell1.scs"
amsd {
        portmap subckt=cell1  reffile="cell1.v"
        config cell=cell1 use=spice portmap subckt=cell2  reffile="cell2.v"
        config cell=cell2 use=spice ie vsup=1.8 inst=top
}
```

```
simulator lang=spice
.param temp=27
.param tnom=27
.param VDD=3.3
.param trise=1.2
.include "analog_top_a.scs"
.include "spice_models.scs"

simulator lang=spectre amsd {
    portmap subckt=analog_top_a autobus=yes
    config inst=top.I1 use=spice
    ie vsup=VDD tr=trise*0.01 tf=1ns
}

V1 p 0 vsource type=dc dc=VDD
```

FIG. 24

METHOD AND APPARATUS FOR AMS SIMULATION OF INTEGRATED CIRCUIT DESIGN

RELATED APPLICATION

This application is a divisional of and claims the benefit of priority under 35 U.S.C. §120 to U.S. patent application Ser. No. 12/399,855, filed on Mar. 6, 2009, which is hereby incorporated by reference herein in its entirety.

BACKGROUND OF THE INVENTION

1. Field of the Invention

The invention relates in general to integrated circuits, and more particularly, to mixed-signal simulation and verification of integrated circuit designs.

2. Description of the Related Art

The evolution toward ultra-deep-submicron and nanometer CMOS technologies has fostered the development of mixed-signal integrated circuits that embed on a single die both complex digital circuitry and high performance analog circuitry. Digital signals are discrete-event signals with discrete values that are at a constant discrete value for a period of time, and then abruptly change to a new discrete value. In digital signals, there only are a very few different discrete values, typically two, 'true' and 'false' or logic 'one' and logic 'zero'. Analog signals vary continuously meaning that the value of the signal at any point in time may be any value from within a continuous range of values. Analog signals may be discrete-event signals that are represented as piecewise constant versus time, meaning that a signal holds its value for a period of time before jumping to a new value. Alternatively, analog signals may be continuous versus time meaning that its value varies smoothly as a function of time.

The increasing complexity of systems that can be integrated on a single die has lead to design methodologies that allow designers to design and verify a system at an abstract or block diagram level prior to development of the detailed design of the individual blocks. For example, in a top-down design approach, the performance required of individual blocks to meet overall system performance is evaluated before details of the blocks are fully developed. A typical top-down design flow for a mixed-signal integrated system may involve several distinct phases such as, system design, architecture design, cell design, and cell-layout. The design methodology may involve mapping a system level algorithm to a particular architecture that is partitioned into blocks that represent sections of the circuit to be designed simulated and verified as a unit.

A mixed-signal design comprises both digital and analog circuit blocks. Digital circuit blocks may be specified at the behavioral or RTL or gate level using—a digital HDL (hardware description languages) such as Verilog or VHDL. Analog circuit blocks may be specified at the behavioral or transistor-level using Analog or Mixed Signal an HDLs (hardware description language) such as SPICE or Verilog-AMS. For mixed-signal simulation the digital blocks are simulated using a digital HDL representation and the analog blocks are simulated using an Analog or Mixed Signal HDL representation. Verilog-AMS, is an example of an HDL primarily used to support simulation of analog and mixed-signal systems by describing the system to a simulator. SPICE, is an example of HDL used to describe a design at the transistor level of detail. During architecture development in a top-down design methodology, blocks may be represented abstractly, and a single block may include both analog and digital functionality. As the design is refined the demarcation between analog and digital blocks becomes more precisely defined. When simulating a design, IEs (interface elements), whose functionality is describing using Verilog-AMS, also referred to as connect modules; are inserted between analog and digital blocks to transform continuous domain information to discrete domain or vice versa. In order to ensure that simulation accurately represents reality, a connect module typically is modeled in terms of parameters such as impedance and supply voltages.

The simulation of a mixed-signal circuit that includes both digital and analog blocks involves two methods of simulation: event-driven digital simulation as found in logic simulators and continuous-time analog simulation as found in circuit simulators. Digital blocks are simulated using digital simulator, and analog blocks are simulated using an analog simulator. Techniques have been developed to designate which simulation technique is to be used to simulate each block in a design.

In the course of developing a circuit design, a designer may decide to replace a given digital block in the design with an analog block. For example, different versions of a given design block already may have been verified in pure digital or pure analog verification flow. Designers sometimes wish to switch between those different versions (behavioral, gate-level, transistor-level) of a block for Digital Verification Flow (DVF), Analog Verification Flow (AVF), or Analog Mixed-signal Verification Flow (AMSVF) Verification Flow. One typical reason for replacement of a digital block with an analog block is to achieve more accurate simulation results. For example, a digital block may model a circuit component at a more abstract level that provides less detail concerning the actual structure and behavior of the circuit than does its analog counterpart. Accordingly, a simulation using the analog block often will provide more precise and accurate results. During full chip verification it is often a design choice as to whether to switch some blocks of the design from digital to analog so as to simulate the circuit with more accuracy to ensure better yield during subsequent manufacture of the circuit or to improve performance. This replacement of a digital version of a block with an analog version entails a need to inform the simulator of a change in simulation technique to be applied to the block. In addition, assuming that the given digital block to be replaced is connected to another digital block, such replacement also entails a need to specify digital terminals that correspond to terminals of the analog block that is to replace the given digital block. Moreover, a connect module will be inserted between the new analog block and the other digital block in the design.

While prior techniques to replace a digital design block with an analog design block in a circuit design generally have been acceptable, there have been several shortcomings with their use. For example, languages like Verilog-AMS and VHDL-AMS provide capabilities to address these needs, and these languages are supported in simulation tools. However, these languages can be difficult to master, and a designer may not wish modify a pre-verified block for the purpose of performing mixed-signal simulation and verification. Also, in order to use Verilog-AMS, the analog netlist must be expressed in terms of Verilog-AMS. However, it is not uncommon that the analog netlist is specified in a SPICE-like language. Since Verilog and SPICE are two distinct languages in terms of semantics, it can be difficult to switch blocks between them without manual intervention, which can be time consuming and error-prone. Thus, there has been a need for improvement to techniques to replace a digital design block with an analog design block in an integrated circuit design for use in mixed-signal simulation and verification. The present invention meets this need.

Moreover, while prior techniques to insert interface elements in a mixed-signal design generally have been acceptable, there have been shortcomings with their use. For instance, there have been a need for a technique to insert an interconnect element with a behavior that varies with variations of analog circuit parameters. The present invention meets this need.

SUMMARY OF THE INVENTION

In one aspect of the invention, a computer system display screen shows user input to the computer system that specifies parameter information to determine a binding between an analog circuit block and a digital circuit design component. The user specified parameter information is saved in computer readable storage media within a file that also specifies at least a portion of the analog circuit design. The analog circuit design component specified in the file is associated in computer readable storage media with a first design block of an integrated circuit design that also includes a second digital design block that is coupled to the first design block. The parameter information saved in the file is used to determine a binding between the first analog circuit design component and the second digital design block. The determined binding is saved in computer readable storage media. An advantage of this technique is to map the digital and analog versions of the same block in a single portbind file. This information can be used subsequently by a simulator to interchange an analog version of a block with digital version of the block or vice versa. Also, if a designer wants to change connections between digital and analog blocks, he or she can do so by editing a portbind parameter information.

In another aspect, a computer system display screen shows user input to the computer system that specifies configuration information for a circuit design component. The user specified configuration information is saved in computer readable storage media within a database that also specifies at least a portion of the circuit design component. The circuit design component specified in the file is associated in computer readable storage media with a first design block of an integrated circuit design. The design component is tagged based upon the specified configuration information. An advantage of this technique is the ease and ability of a designer to configure the circuit design blocks in the design, as analog or digital in conjunction with the information specified in a portbind file.

In yet another aspect, a computer system display screen shows user input to the computer system that specifies variable parameter information to be used in converting a signal communicated with an analog circuit design component between a first analog domain and a digital domain. The user specified parameter information is saved in computer readable storage media within a file that also specifies at least a portion of the analog circuit design. One or more connect rules are provided in computer readable media that are dependent upon the variable parameter information. The analog circuit design component specified in the file is associated in computer readable storage media with a first design block of an integrated circuit design, which also includes a second design digital block that is coupled to the first design. A connect module is inserted between the first analog circuit design component and the second digital design block. The connect module is compliant with the one or more connect rules and has behavior that is dependent upon the user specified variable parameter information. The connect module is saved in computer readable storage media. An advantage of this technique is the ability to generate a set of custom or parameterizable connection rules which are used to aid in mixed-signal simulation.

In some embodiments, for example, a control block that includes portbind parameters, configuration parameters and interconnect element parameters advantageously abstracts HDL (e.g., Verilog-AMS language) complexity into a simple, easy-to-read set of command statements for simulating a digital HDL with a SPICE-like language. This enables easy creation, management and debugging of mixed-signal simulations. An advantage in some embodiments is an ability to control the mixed-signal simulation from a SPICE file. It also allows mixed-signal settings to be dependent on global analog parameters and digital parameters and so allows sharing of settings across the analog and digital domains. Another advantage in some embodiments is the provision of a simple-yet-powerful interface to configure analog and digital (e.g., Verilog/SPICE) blocks, including capabilities to verify multiple-power supply designs with automatic insertion of interface elements (IEs) and custom connect rules across D/A boundaries. Furthermore, some embodiments support the ability to remove a block from a design without changing the 'golden' netlist (commonly referred to as 'stub views') for both analog and digital designs. Moreover, some embodiments allow the same SPICE deck (used for mixed signal simulation) to be given as a direct input to an analog simulator with no edits. The analog simulator automatically ignore the 'AMS' content and simulate only the analog content.

BRIEF DESCRIPTION OF THE DRAWINGS

The aforementioned features and advantages of the invention, as well as additional features and advantages thereof, will be more clearly understandable after reading the detailed description of embodiments of the invention in conjunction with the following drawings.

FIG. 1 is an illustrative drawing of a computer system screen display showing a control block input by a designer in accordance with some embodiments of the invention. In some embodiments discussed herein, the control block is referred to as an 'amsd' control block.

FIG. 2 is an illustrative drawing of a computer system display screen showing an example portmap command input by a user in accordance with some embodiments of the invention.

FIG. 3 is an illustrative drawing of a computer system display screen showing an example config command containing cell and instances input by a user in accordance with some embodiments of the invention.

FIG. 4 is an illustrative drawing of a computer system display screen showing an example ie command containing scope and parameters input by a user in accordance with some embodiments of the invention.

FIG. 5 is an illustrative drawing of a computer system screen display showing a various parameters provided in an analog mixed signal (AMS) control file listing that includes a global parameter VDD (highlighted).

FIG. 7 is an illustrative drawing of a computer system screen display showing a control block (e.g., amsd) that imports various analog SPICE blocks into Verilog.

FIG. 8 is an illustrative drawing of a computer system screen display showing a control block (e.g., amsd) that describes a SPICE-in-middle (or SPICE sandwich) case.

FIG. 9 is an illustrative drawing of a computer system screen display showing a control block (e.g., amsd) that describes how a designer could use a SPICE stub, SPICE subckt and Verilog stub in the design.

FIG. 10 is an illustrative drawing of a computer system screen display showing a control block (e.g., amsd) that shows use of an ie command in a control block to specify different power supply voltages for different instances, cells and their ports.

FIG. 10A is an illustrative drawing of a computer system display screen showing an example showing of how the SPICE sub-circuit 'analog_top' uses the parameters to configure and connect the ports between the SPICE and the Verilog boundaries in accordance with some embodiments of the invention.

FIG. 15 is an illustrative drawing of a computer system screen display showing a control block used to specify the analog circuit component (i.e., the sub-circuit) to be substituted in to instance I1 of cell 'cell1' in accordance with some embodiments of the invention.

FIGS. 16A-16B are illustrative block level diagrams of a digital version (FIG. 16A) and an analog version (FIG. 16B) of the same example cell. In this example, the example cell is named 'cell1'.

FIG. 17 is an illustrative drawing of a computer system screen display showing a control block containing a portbind file that specifies a portbind file parameter that specifies a correspondence between the digital and analog versions of cell1 in FIGS. 16A-16B for use in portbind generation in accordance with the process of FIGS. 11A-11C in accordance with some embodiments of the invention.

FIG. 18 is an illustrative block level diagram showing connectivity mapping between the analog and digital versions of the example cell of FIGS. 16A-16B using the portbind file of FIG. 17 in accordance with some embodiments of the invention.

FIG. 19 is an illustrative block level diagram of a digital version representing the circuit design having a descending bus 'b'. Example code for digital 'cell1' of FIG. 19 is presented in Table 8.

FIG. 20 is an illustrative drawing of a computer system screen display showing a control block containing a portmap command that specifies a file parameter that directly specifies a correspondence between the digital and analog versions of cell1 in FIG. 19 and FIG. 16B for use in portbind generation in accordance with the process of FIGS. 11A-11C in accordance with some embodiments of the invention.

FIG. 21 is an illustrative block level diagram showing connectivity mapping between the analog (e.g., SPICE) and digital (e.g., Verilog) versions of the example cell of FIG. 19 and FIG. 16B using the portmap command of FIG. 20 in accordance with some embodiments of the invention.

FIG. 24 is an illustrative drawing of a computer system screen display showing an AMS control file listing a set of parameters including a global SPICE parameter, VDD, and also including a control block having an ie command that that includes the global parameter in accordance with some embodiments of the invention.

DETAILED DESCRIPTION OF THE PREFERRED EMBODIMENTS

Figure 6:
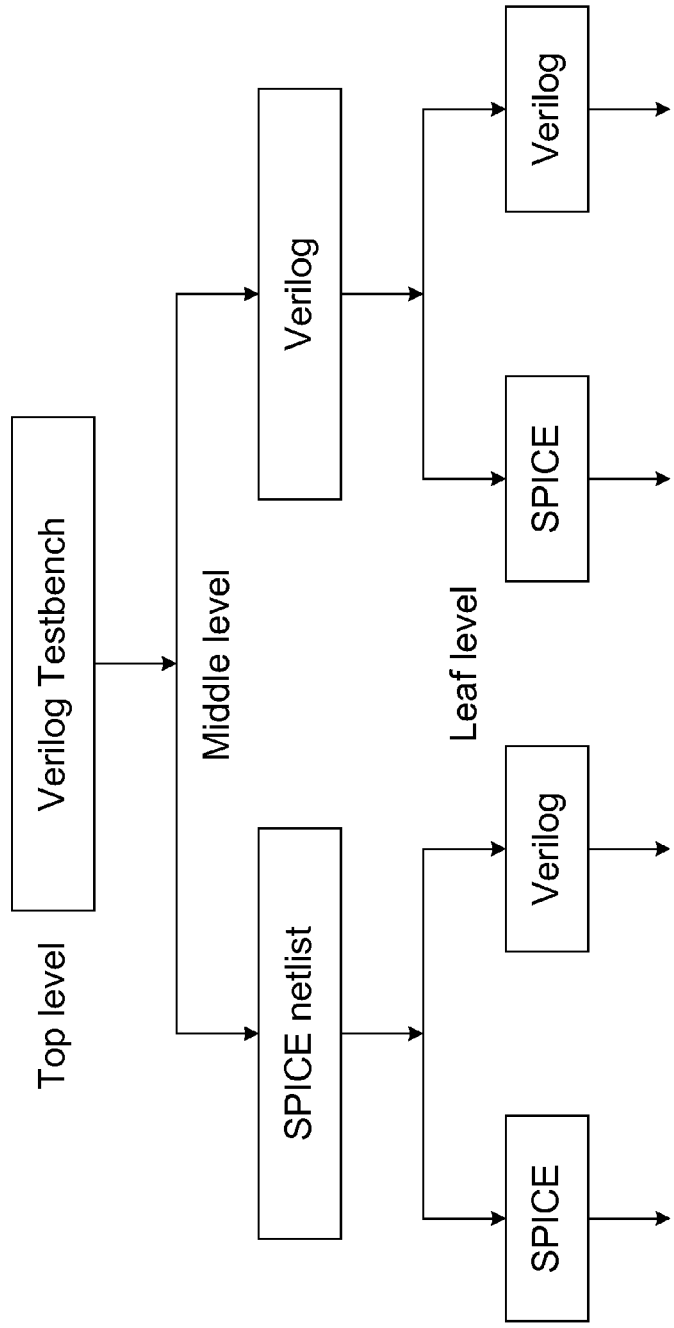
FIG. 6 is an illustrative diagram of a typical hierarchical structure of an integrated circuit design.

The following description is presented to enable any person skilled in the art to make and use a computer implemented system and method and apparatus to use with analog mixed-signal simulation in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Overview

FIG. 1 is an illustrative drawing of a computer system screen display showing a control block input by a designer in accordance with some embodiments of the invention. In some embodiments discussed herein, the control block is referred to as an 'amsd' control block. The control block comprises a command block provided within a file providing a source code description of an analog design block. The source code file and the novel control block within it are stored in computer readable media. In some embodiments, an 'amsd' control block is an analog simulation tool command block inside a SPICE (or a SPICE-like language) file. The control block contains a set of commands, sometimes referred to herein as 'cards' (SPICE like commands) that specify port mapping, configuration and interface element information. These commands (cards') are referred to herein as 'portmap', 'config' and 'ie' commands. The commands include parameter names and values that represent parameter settings to specify the control information for use during AMS (analog mixed-signal) simulation and verification. In some embodiments, the control file is represented using SPICE or SPICE-like syntax and hence is easily recognized by analog simulators. Thus, for example, users familiar with the analog circuit language (e.g., SPICE) can easily use control blocks (e.g., the 'amsd' block) inside their input SPICE source files to specify 'AMS' (Analog Mixed-Signal) content. The various commands such as, 'portmap' (for sub-circuit interface between analog and digital), 'config' (for cell or instance binding as SPICE, HDL or stubs), and 'ie' (interface element) serve specific purpose needed for AMS including mapping parameters to specify connections between analog/digital cell and instance configurations.

The control block contains statements that control AMS mechanisms when the design is processed by iron, in the mixed-signal design verification flow. The SPICE parser reads and applies input statements (also called as input cards) defined in 'amsd' block and uses them during mixed-signal verification flow. Statements in the control block can be used to specify the design configuration, connect module settings, SPICE design files, and simulation control, as well as to configure a particular cell reference in a Verilog-AMS source file to be bound to a SPICE description of that cell, for example.

The following Table 1 provides a brief description of three control block commands in accordance with some embodiments of the invention.

TABLE 1

| Statement | Description |
| --- | --- |
| Portmap | The portmap statement tells the simulator tool how an analog (e.g., SPICE) sub-circuit should appear to digital interface |
| Config | The config statement specifies which definition to use for particular cells or instances |
| ie | The ie statement specifies interface element parameters, optionally for a particular design unit. If a limitation upon the scope of the parameters is not specified, such as to a given a design unit for example, the simulator applies the parameter settings to all interface elements globally. |

The 'portmap' command is used to guide a computer program-based simulator tool in the interpretation of an analog circuit design (e.g., SPICE) to ensure communications between analog circuit design blocks and digital circuit design blocks (e.g., Verilog modules). The 'portmap' command can be used to specify parameters such as sub-circuit name, sub-circuit port case, its port directions, etc.

In some embodiments the portmap command is specified as follows:

portmap<parameter=value>

Table 2 below illustrates the grammar and parameters associated with a portmap card in accordance with some embodiments of the invention.

TABLE 2 subckt—The subckt for which the portmap is being created. If no subckt is given, the parameter settings will apply as default to all portmap cards that follow
module—The module for which the portmap file interface is created. This is only applicable for Spice-in-middle (or Spice-Sandwich) case.
stub—The name of stub for which the portmap is being created. The stub can be specified for spice or Verilog blocks. The stub name is used along with the 'match' card. Both, subckt and stub can not be specified simultaneously.

TABLE 2-continued match—Applies only for the use = stub in 'config' card. It specifies the whether the stub interface should match the Verilog version of the cell or the spice version of the cell. Choices: verilog/spice,
Default: verilog
autobus—Indicates that verilog busses should be mapped to SPICE ports. Choices: yes/no, Default: yes
busdelim—Bus delimiters. Valid Values: [ ], _, <> or none (empty).
Default: [ ] <>
casemap—Used to be able to ignore case differences in the name.
Choices: upper/lower, Default: lower
portcase—Used to be able to specify port cases Choices: upper, lower, keep.
excludebus—To specify that some things are not busses and should not be mapped. Takes a list of arguments, no default.
reversebus—To specify the reversebus name
input—Used to specify a net is an "in" port. No default.
output—Used to specify a net is an "out" port. No default.
inout—Used to specify a net as an "in/out" port. No default.
file—Portbind file to name. Note if portbind file is specified, all portmap parameters other than subckt will be ignored.
reffile—Verilog module or VHDL reference file used to create port mappings for spice subckt.
refformat—verilog (default) or vhdl. The reffile and refformat cards are allowed and used in pairs.
porttype—This parameter controls the behavior in which port-bind files are created for the verilog-spice interface. Valid values are: order and name. Default: order FIG. 2 is an illustrative drawing of a computer system display screen showing an example portmap command input by a user in accordance with some embodiments of the invention. In this example, the portmap command specifies that the analog, SPICE subckt 'pll' is to be interpreted to the digital interface (Verilog, VHDL, VerilogAMS, VHDL-AMS, SystemC etc.) with automatic buses created.

The 'config' command is used to configure a particular cell or instance within a digital (e.g., Verilog) block as analog (e.g., SPICE) or vice-versa. The 'config' command can be used to specify specific cell definition for particular circuit design simulation scenarios which contain an instantiation of that cell-name or instance-name.

In some embodiments the config command is specified as follows:

config<parameter=value>

Table 3 below illustrates the grammar and parameters associated with a config card in accordance with some embodiments of the invention.

TABLE 3 cell—The instantiation cellnames to which this use-card applies
inst—The full hierarchical path of a particular instantiation to which the use-card applies. This can be a single name or a list of names.
use—The definition to use for the instantiations referred by this card.
This is a mandatory parameter. Valid Choices: hdl, spice, stub. No default.

FIG. 3 is an illustrative drawing of a computer system display screen showing an example config command containing cell and instances input by a user in accordance with some embodiments of the invention.

The 'ie' (interface element) command can be used to specify a set of interface elements with customized parameter values to be used when converting signals between the analog and digital domains. For example: vsup, tr, tf, etc. Parameter values can be specified as a global setting or to be specific to a particular cell, instance or net, for example. Based upon these specifications, the AMS simulator in accordance with some embodiments of the invention automatically inserts appropriate interface elements at the digital/analog (e.g., Verilog/SPICE) boundary.

In some embodiments the ie command is specified as follows:

ie<scope=value><parameter=value>

Tables 4-5, below illustrate the grammar and parameters associated with an ie card in accordance with some embodiments of the invention. In the 'ie' command, vsup (supply voltage) is a mandatory parameter. The scope parameter indicates the current cell, instance, library scope to which the parameter is applied.

Table 4 sets forth different scope settings that can be input using the ie command in accordance with some embodiments of the invention. These ie commands are applicable for the domainless nets only in the design.

TABLE 4 cell—The instantiation cellnames to which this customization will apply.
inst—The full hierarchical path of a particular instantiation to which customization will apply.
lib—The library of design units to which the customization will apply.
net—The net or list of domainless nets to which the customization applies
instport—The list of domainless net, instance ports to which the customization applies
cellport—The list of domainless net, cell ports to which the customization applies Table 5 sets forth various parameters that can be input using the ie command in accordance with some embodiments of the invention.

TABLE 5 vsup—The final value for logic 1 voltage. It is a mandatory parameter
vthi—Voltages above this will be logic 1. Default based on specified connect rule
vtlo—Voltages below this will be logic 1. Default based on specified connect rule
vx—Final value for logic x. logic 1. Default based on specified connect rule
tr—Rise time for analog transition, from vtlo to vthi or vx. Default: 0.2 ns
rlo—Output resistance for L2E when digital input is '0'. Default 200 Ohms
rhi—Output resistance for L2E when digital input is '1'. Default 200 Ohms
rx—Output resistance for L2E when digital input is 'x'. Default 40 Ohms
rz—Output resistance for L2E when digital input is 'z'. Default 10 Mega Ohms
txdel—The parameter use to control txdig with in the E2L and Bidir files
dspmode—To specifiy if discipline is forced or not. Valid values: set (for forced discipline), by default, dspmode is not applied.
connrules—The type of the connect rule to be applied to the 'ie' card. Valid values: full, full_fast, basic. Default: full_fast FIG. 4 is an illustrative drawing of a computer system display screen showing an example ie command containing scope and parameters input by a user in accordance with some embodiments of the invention.

In accordance with one aspect of the invention, the ie command can be used to create a parameterized set of connect rules and interface elements across an analog to digital boundary in an integrated circuit design. Such a set of varying connect rules can be used during simulation. For example, a VDD parameter from the analog (e.g., SPICE) domain can correlate and govern a set of interface elements (IEs) inserted across an analog to digital boundary within the design.

FIG. 5 is an illustrative drawing of a computer system screen display showing a various parameters provided in an analog mixed signal (AMS) control file listing that includes a global parameter VDD (highlighted). The display also includes a control block (i.e., amsd) indicates that the supply voltage (vsup) is determined based upon the value of VDD, which is variable.

User Interface Examples

FIG. 6 is an illustrative diagram of a typical hierarchical structure of an integrated circuit design. In this example, the top level of the design comprises a digital (e.g., Verilog) test bench. A middle level comprises both analog blocks (e.g., SPICE netlist) and digital blocks (e.g., Verilog). A leaf level also comprises both analog blocks (e.g., SPICE netlist) and digital blocks (e.g., Verilog). Note that although SPICE and Verilog are used in this example, other languages or formats such as Verilog-D, VHDL, SystemVerilog etc. may be used instead as will be readily understood by persons of ordinary skill in the art.

FIG. 7 is an illustrative drawing of a computer system screen display showing a control block (e.g., amsd) that imports various analog SPICE blocks (analog_top_a/b/c/d etc.) into Verilog. The control block includes a config command that indicates the four analog cells to be imported to Verilog. This is an example of a 'Spice-on-leaf' design because the config command contains a parameter called as 'use=spice' which tells the simulator to use the SPICE version of these four cells while simulating the mixed-signal design. The include statement actually contains the definition of the four SPICE blocks. It will be appreciated that FIG. 7 shows how a designer can bring multiple SPICE blocks into Verilog with a simple one line statement in accordance with some embodiments of the invention. In another aspect, a designer can use wildcards, such as for example, asterisk "*", to indicate that bring in multiple SPICE blocks with just a one simple statement. A designer can change the config statement to contains "cell=analog_top_*", in accordance with some embodiments, which will automatically look for all cells defined in the include SPICE file which need to be imported into the Verilog The ie command specifies vsup of 1.8 in this design example.

FIG. 8 is an illustrative drawing of a computer system screen display showing a control block (e.g., amsd) that describes a SPICE-in-middle (or SPICE sandwich) case. In this example, the design contains a top level Verilog (digital) module which contains an instance of a SPICE sub-circuit which in turn instantiates the digital module. The control block includes a config command with use=spice and use=hdl to describe these scenarios in different commands. In this example, the top level Verilog module instantiates an 'analog top' SPICE block which in turn instantiates a 'digital_leaf' module. The config command describes this for each of the blocks FIG. 9 is an illustrative drawing of a computer system screen display showing a control block (e.g., amsd) that describes how a designer could use a SPICE stub, SPICE subckt and Verilog stub in his design. Typically, a stub is employed by a designer to remove an instance or cell from a design without changing the netlist. A stub indicates to a simulation or verification tool to use a stripped down version of the cell for the instantiation. The control block of FIG. 9 shows to stub out the SPICE instance named 'top.analog_block1' which is defined inside sub-circuit analog_block, use the SPICE instance 'top.xanalog_block2' to use as a normal SPICE instance and use the instance 'top.digital_block3' which is defined in Verilog module called as 'digital_block' to be used in the design. All these different instances are the part of a top level Verilog-AMS test bench. This example shows use of stubs analog and digital blocks in the design in accordance with some embodiments of the invention.

FIG. 10 is an illustrative drawing of a computer system screen display showing a control block (e.g., amsd) that shows use of an ie command in a control block to specify different power supply voltages of 1.8V, 2.4V, 3.3V for different instances, cells and their ports. In this example, specified voltage value 2.4V is applied to the specific instance 'testbench.vlog_buf', and 3.3V is applied to all the instance and cell ports of 'topI1.in' and 'mid.w1'; in the ie command scope respectively. The scoped voltage values are applicable to all the scopes within the given scope and the global supply voltage of 1.8V is applied to rest of the design.

FIG. 10A is an illustrative drawing of a computer system display screen showing an example showing of how the SPICE sub-circuit 'analog_top' uses the bus delimiter="[ ]" and portcase=lower to configure and connect the ports between the SPICE and the Verilog boundaries in accordance with some embodiments of the invention.

Method for Portbinding

Figure 11A:
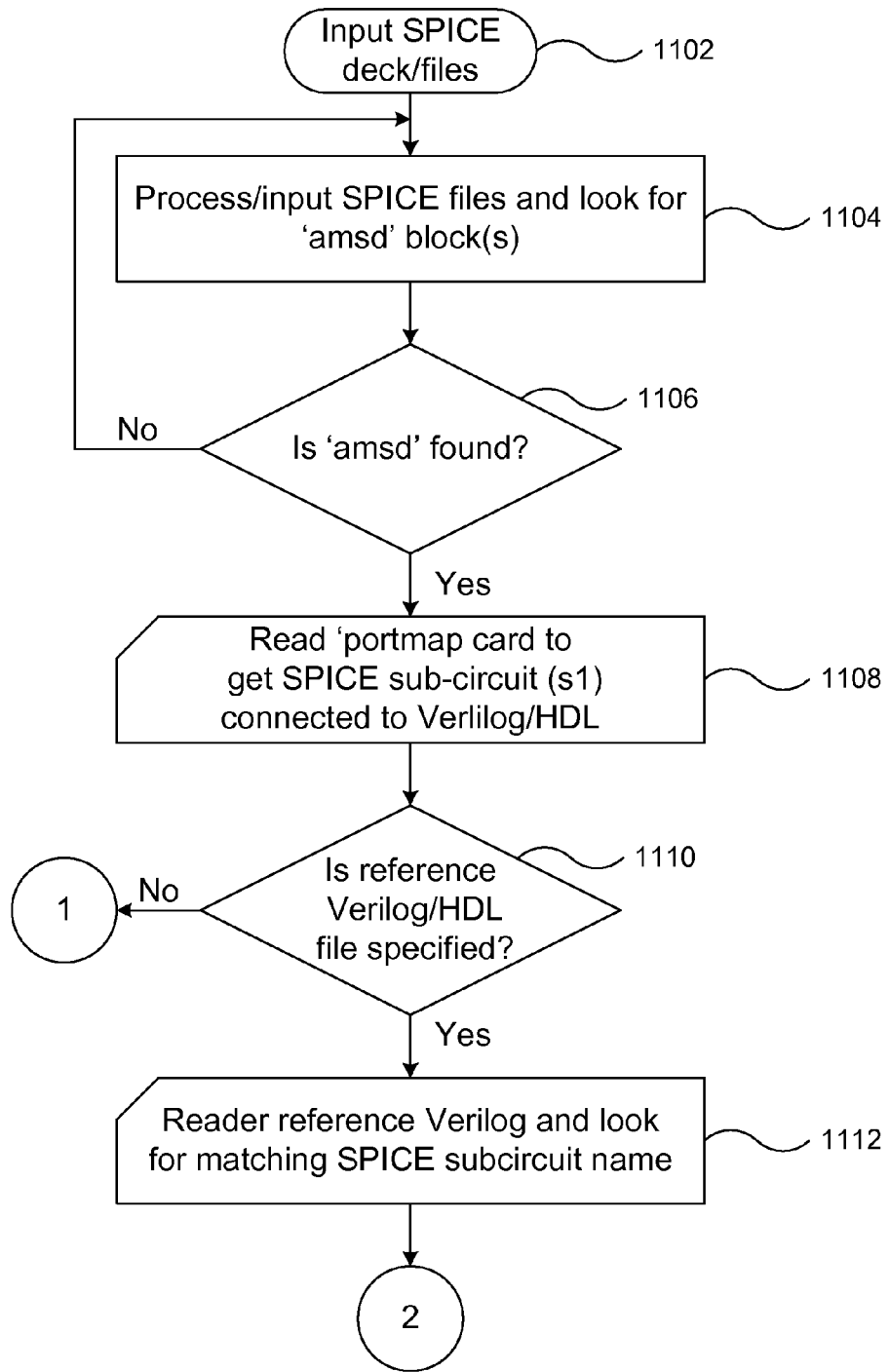
FIGS. 11A-11C provide an illustrative flow diagram of a process to use a control module command to correlate and connect an interface at the boundary of analog and digital circuit blocks in an integrated circuit design in accordance with some embodiments of the invention.
Figure 11B:
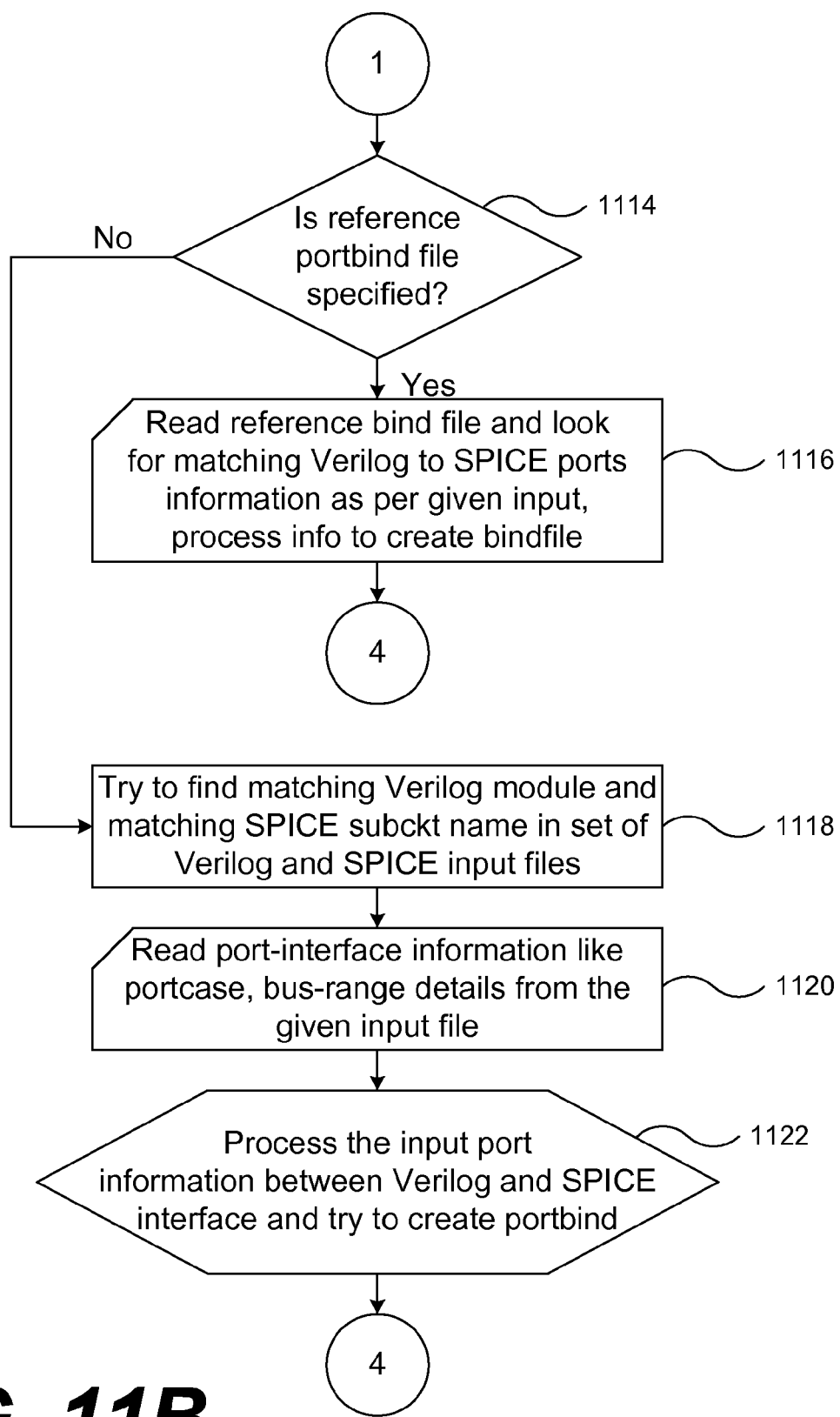
Figure 11C:
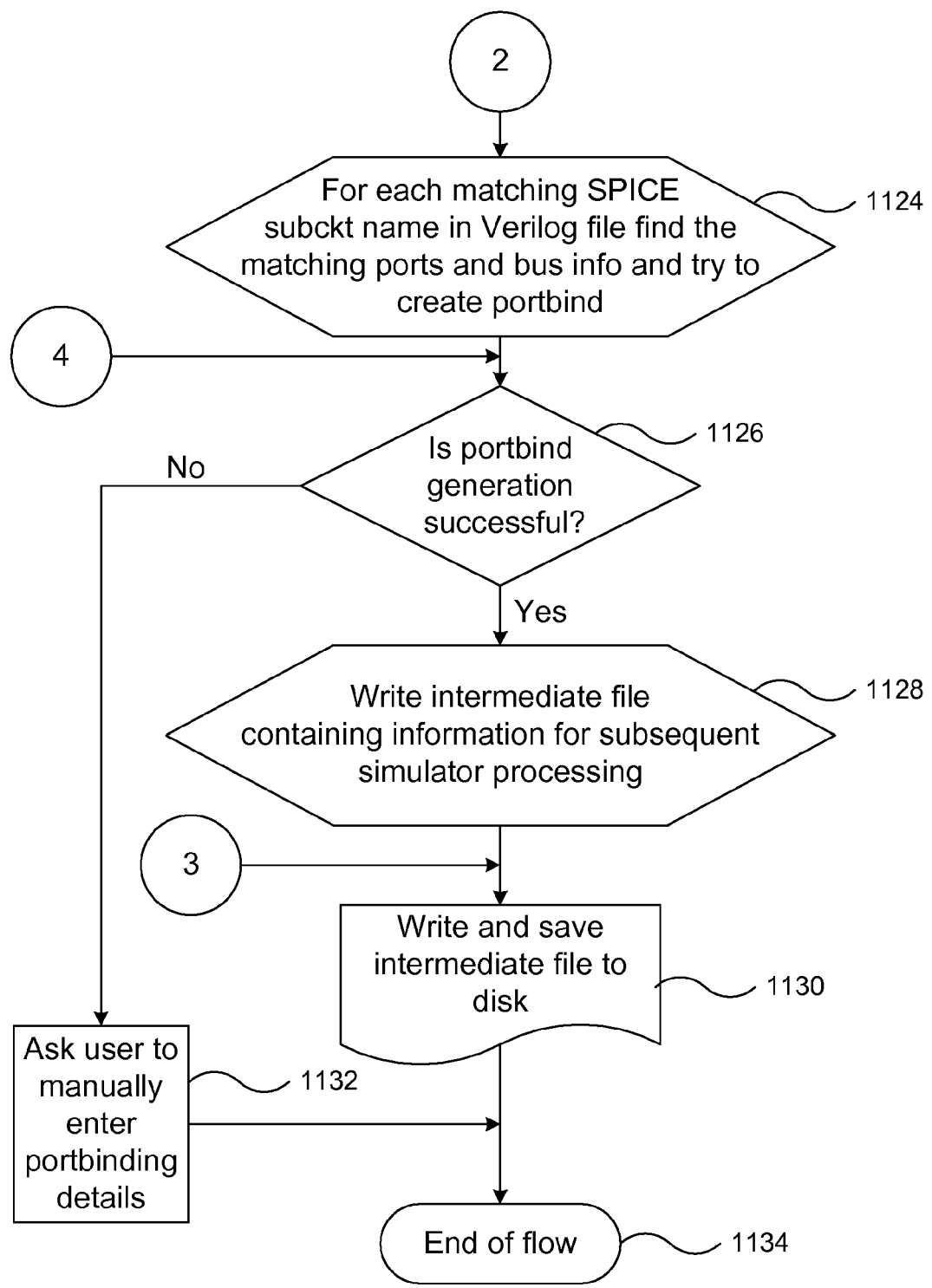

FIGS. 11A-11C provide an illustrative flow diagram of a process to use a control module command to correlate and connect an interface at the boundary of analog and digital circuit blocks in an integrated circuit design in accordance with some embodiments of the invention. The process of FIGS. 11A-11C is implemented using a computer system encoded with computer readable code to cause the system to perform the functions in the various blocks of the flow diagram. The function modules in the flow diagram correspond to computer program code encoded in a computer readable storage medium that is used to cause the computer system to implement such functions. It will be appreciated that the process of FIGS. 11A-11C performs a portbind generation function that is one part of a process to associate an analog circuit design component with a block of an overall integrated circuit design that may comprise many different circuit blocks.

In function module 1102, a file specifying an analog circuit design component (e.g., SPICE deck or files) is input to a computer system (not shown). The terms "file" and "deck" shall be used interchangeably to refer to the structure in computer readable media that contains a description of an analog design. The computer system runs a computer software tool that parses the SPICE files and looks for 'amsd' control content inside the simulator engine and do extra processing based on its contents. In function module 1104, the software tool or the mixed-signal simulator engine parses the received file to look for control (e.g., amsd) blocks. In decision function module 1106, a determination is made periodically as to whether a control block has been located in the file. If function module 1106 determines that a control block has not yet been located, then the process flow returns to module 1104 to continue the search for control blocks.

If decision function module 1106 determines that a control block has been located, then process flow proceeds to function module 1108, which identifies analog (e.g., SPICE) sub-circuit designs specified within the received analog file that are to be connected to digital (e.g., Verilog) blocks. In decision function module 1110, a determination is made as to whether a reference digital circuit design component (e.g., through a reffile parameter) is specified as being associated with the analog sub-circuit designs identified by function module 1108.

If decision function module 1110 determines that a reference digital circuit design component is specified, then process flow proceeds to function module 1112, which reads the reference digital circuit design component name and interprets the analog circuit design interface that are connected to the digital circuit design component. Control flow then proceeds to decision function module 1124, which uses parameters specified in the control block to correlate constituents of the analog sub-circuit interface e.g., port names, port case (lower or upper case of ports), bus range (bus vector size), bus delimiters (the strings used to represent buses, e.g. a[0:3] or a<0:3> note square and angular braces) etc. details with constituents of the corresponding reference digital circuit interface.

Following function module 1124, control flow proceeds to decision function block 1126, which determines whether the portbind has been successful, that is whether the interface of the sub-circuit identified in function module 1108 has been correlated with the interface to an equivalent digital circuit component. "Equivalent' in this context means preserving the same port interface. A portbind might be unsuccessful for any of numerous reasons. For example, there might be an ambiguity in the ordering or naming of SPICE ports or pins of a Verilog bus; or there may be a user error in the input of parameter information.

If the determination is that the portbind has been successful, then process flow proceeds to function module 1128, which writes an intermediate file containing a digital (e.g., Verilog) representation of the analog (e.g., SPICE) sub-circuit design component for simulation. In function module 1130, the intermediate file is saved to computer readable medium. Flow then ends at module 1134.

The intermediate file is used, for example, to help the simulator understand the design details of the analog and digital components and their boundary ports. The portbind information is used to know which and how ports from SPICE (analog) are connected to the Verilog (or digital). This information is helpful in doing connections between Analog and Digital.

If on the other hand, decision function module 1126 determines that portbind generation was not successful, then in function module 1132, the user is requested to enter portbind details so as to create a portbind file. Flow then ends at module 1134. The simulation tool and the process of FIGS. 11A-11B may have to run again, and next time the portbind file created pursuant to module 1132 can be specified in the control block using the file parameter in some embodiments, for example. Decision module 1114 described below can identify the newly created portbind reference file in the next simulation run, for example.

If on the other hand, decision function module 1110 determines that no reference digital circuit design component is specified, then process flow proceeds to decision function module 1114, which determines whether the control block specifies a reference portbind file (e.g, through a file parameter). If a determination is made that a reference portbind file has been specified, then process flow moves to function block 1116, which reads the reference portbind file and looks for matching interface constituents (e.g., matching SPICE ports to Verilog bus) pursuant to parameters specified in the control block. Process flow then moves to decision module 1126 and proceeds as described above.

However, if decision module 1114 fails to identify a reference portbind file, then flow moves to function module 1118, which searches for a digital circuit design component that matches the sub-circuit identified in module 1108. Once a matching digital circuit component has been identified, flow goes to function module 1120, which uses parameters specified in the control block such as portcase, busdelim, etc. to correlate constituents of the digital circuit interface with constituents of the identified analog sub-circuit interface. Refer to FIG. 10A, for example. Next, flow proceeds to function module 1122, which processes input port information between digital (e.g., Verilog) and analog (e.g., SPICE) interfaces to attempt to create a portbind based on the parameters e.g. portcase, busdelim, autobus etc. being read from the portmap card. Process flow then moves to decision module 1126 and proceeds as described above.

Method for Simulator Configuration Binding

Figure 12:
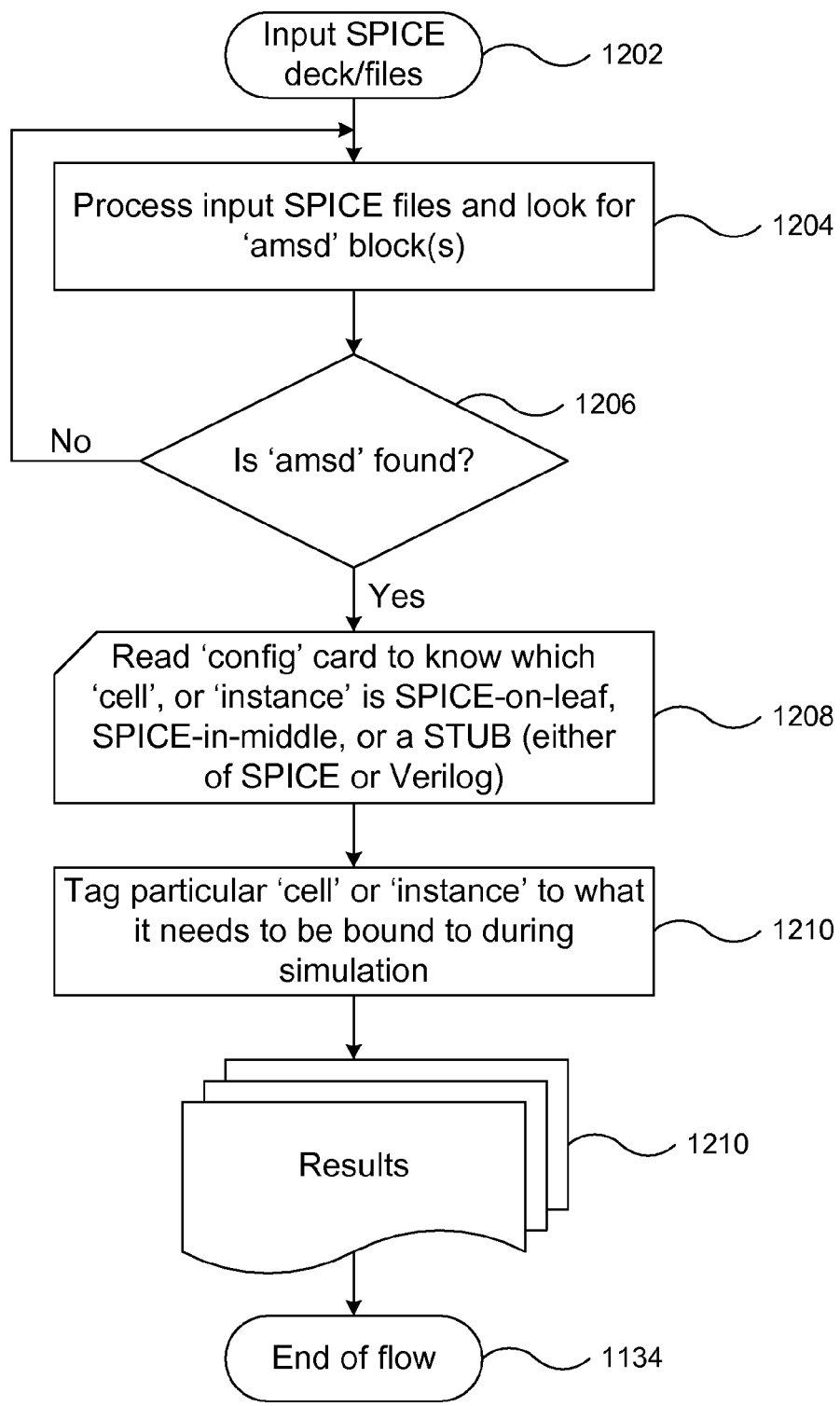
FIG. 12 provides an illustrative flow diagram of a process to use a control module command configure circuit design blocks within an integrated circuit design for AMS simulation in accordance with some embodiments of the invention.

FIG. 12 provides an illustrative flow diagram of a process to use a control module command configure circuit design blocks within an integrated circuit design for AMS simulation in accordance with some embodiments of the invention. The process of FIG. 12 is implemented using a computer system encoded with computer readable code to cause the system to perform the functions in the various blocks of the flow diagram. Simulation of a circuit design that includes both analog and digital design blocks typically requires that analog blocks be simulated using an analog simulation tool and that digital blocks be simulated using a digital simulation tool. It will be appreciated that the process of FIG. 12 performs a config generation function that is one part of a process to associate a circuit design component with a block of an overall integrated circuit design that may comprise many different circuit blocks. Note that the config statement works both for analog and digital. It is up to the simulator to find that information based on the parameters in the config command.

FIG. 12 illustrates a configuration process to designate which simulator to use to simulate different blocks in the design. Moreover, during simulation, some blocks may be deliberately ignored or switched to use another view. This is done to ensure that the simulation results are accurate and robust. These blocks are sometimes referred to as 'stubs'. Although a stub block is stripped down during simulation, the connectivity of the block is maintained to avoid short circuit problems, for example.

In function module 1202, a file specifying an analog circuit design component is input to a computer system (not shown). The computer system runs a computer software tool that processes the blocks in the design and tries to configure them as analog, digital or stubs. In function module 1204, the software tool parses the received file to look for control blocks. In decision function module 1206, a determination is made as to whether a control block has been located in the file. If function module 1206 determines that a control block has not yet been found, then the process flow returns to function module 1204 to continue the search for control blocks.

However, if decision function module 1206 finds a control block, then process flow moves to function module 1208, which reads the config command to determine which analog cell or analog instance is SPICE-on-leaf, SPICE-in middle or a STUB (either SPICE or Verilog). The decision to bind an instance as SPICE-on-leaf or SPICE-in-middle is directly governed by the config command which contains the 'use' parameter. This affects the simulation results and hence the final output which the user might expect. Based upon the results obtained by module 1208, function module 1210 tags (not shown) the particular cell or instance to indicate what it should be bound to during simulation. As used herein, 'tagging' involves applying names or labels to design blocks to determine on which blocks of the circuit the discrete simulation (digital) should be used and on which blocks of the design a continuous (analog) simulation should be used.

Function module 1212 stores the results of the tagging to computer readable storage media for use during simulation. The process ends at module 1214. The tagging results are stored in a database (not shown) accessed by the analog and digital simulators to determine which simulator is to be used to simulate different circuit design components and to determine which design components have been designated as stubs to be stripped during simulation.

Method for Connect Rules/Interface Element Generation

Figure 13A:
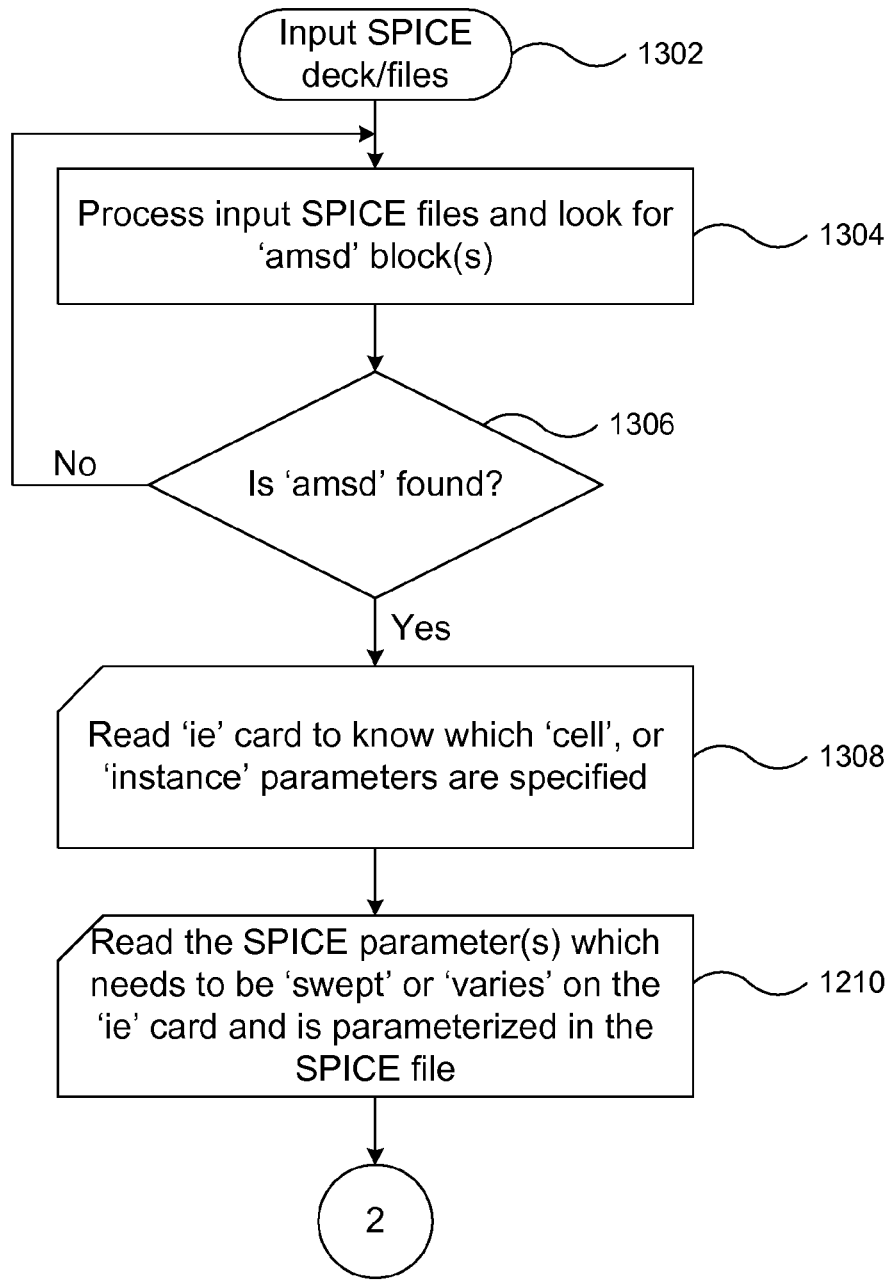
FIGS. 13A-13B provide an illustrative flow diagram of a process to use a control module command to generate connect rules and corresponding interface elements between digital and analog circuit design blocks in accordance with some embodiments of the invention.
Figure 13B:
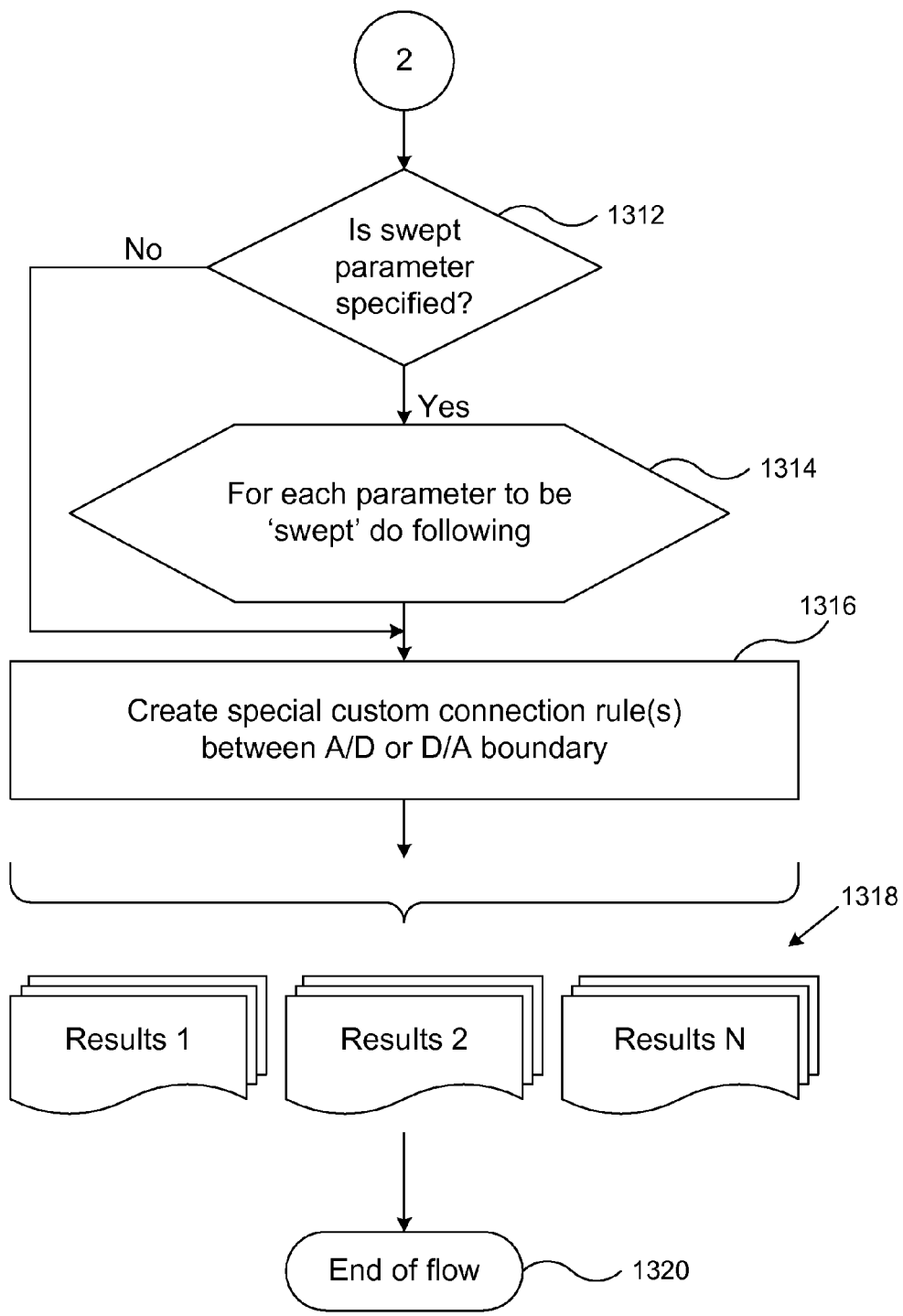

FIGS. 13A-13B provide an illustrative flow diagram of a process to use a control module command to generate connect rules and corresponding interface elements between digital and analog circuit design blocks in accordance with some embodiments of the invention. The process of FIGS. 13-13B is implemented using a computer system encoded with computer readable code to cause the system to perform the functions in the various blocks of the flow diagram. It will be appreciated that the process of FIGS. 13A-13B performs an interface element insertion function that is one part of a process to associate an analog circuit design component with a block of an overall integrated circuit design that may comprise many different circuit blocks. Thus, 'associating' in this context involves looking for the connections or ports between analog blocks and digital blocks where interface elements or connection rules are needed so as to connect analog to digital or vice versa.

An 'interface element' comprises a structure stored in computer readable storage media that contains code used to translate and propagate signals between nets that have different discipline domains (e.g., electrical and digital) and that are connected via a port. Interface element also may be referred to as connect modules. 'Connect rules' comprise the rules used to generate interface elements. As used herein, a 'signal' comprises a hierarchical collection of nets, which because of port connections, are contiguous.

In function module 1302, a file specifying an analog circuit design component is input to a computer system (not shown). The computer system runs a computer software tool that parses the input SPICE and does processing to read its contents and generate the equivalent output or data In function module 1304, the software tool parses the received file in search of control blocks. In decision function module 1306, a determination is made as to whether a control block has been located in the file. If function module 1306 determines that a control block has not yet been found, then the process flow returns to function module 1304 to continue the search for control blocks.

If on the other hand, decision function module 1306 finds a control block, then process flow moves to function module 1308, which reads the ie command to determine which cell or instance parameters are specified. Function module 1310 reads the analog (e.g., SPICE) parameters set forth in the analog file that specifies the analog circuit design to determine whether there are parameters that are to be swept (i.e., varied). The SPICE parameters can be specified as a part of the input SPICE file and they can reside anywhere in the input SPICE deck. Since, these are analog variables or parameters to be swept they are not defined or present inside the 'amsd' control block. Decision function block 1312 periodically determines whether there is a parameter from the analog circuit design, which is to be swept identified by module 1310. That also is a parameter that is specified within the control (amsd) block within the ie command. If there is no parameter or variable which needs to be swept specified in 1310, and decided by 1312 then go to step 1316 and create the special custom connection rules between A/D or D/A boundary.

If decision module 1312 identifies such a parameter, then for each such parameter, function module 1314 causes function module 1316 to create connection rules between Analog to digital and digital to analog boundaries. The connection rules are stored in computer readable storage media 1318. The process ends at 1320. If on the other hand, decision module 1312 does not identify a variable parameter from the analog circuit design then flow moves to module 1316 and proceeds as described above.

Figure 14A:
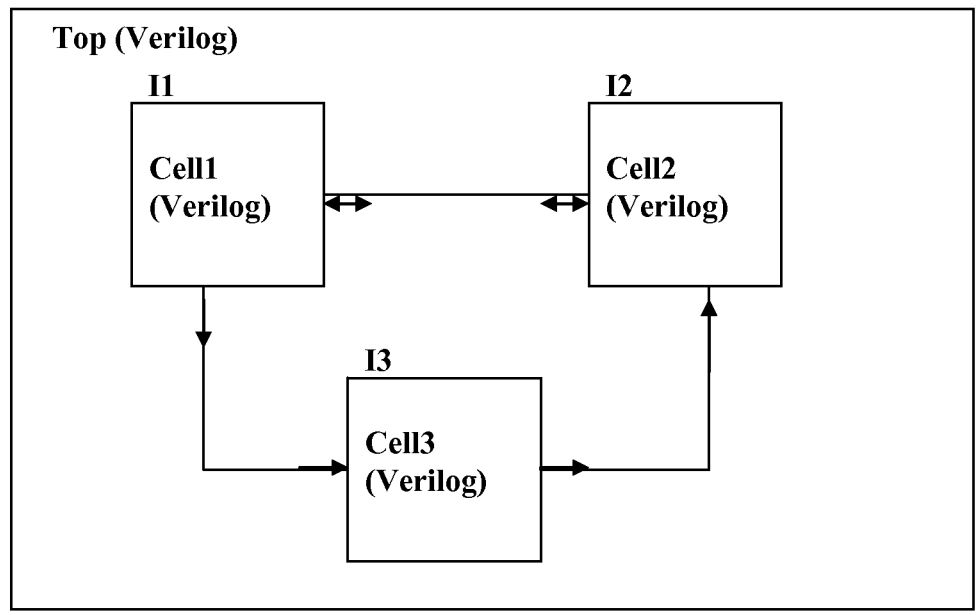
FIGS. 14A-14B are illustrative hierarchical circuit block level diagrams of an integrated circuit design that is converted from being purely digital (FIG. 14A) to being a mixed signal design that contains both analog and digital blocks (FIG. 14B).
Figure 14B:
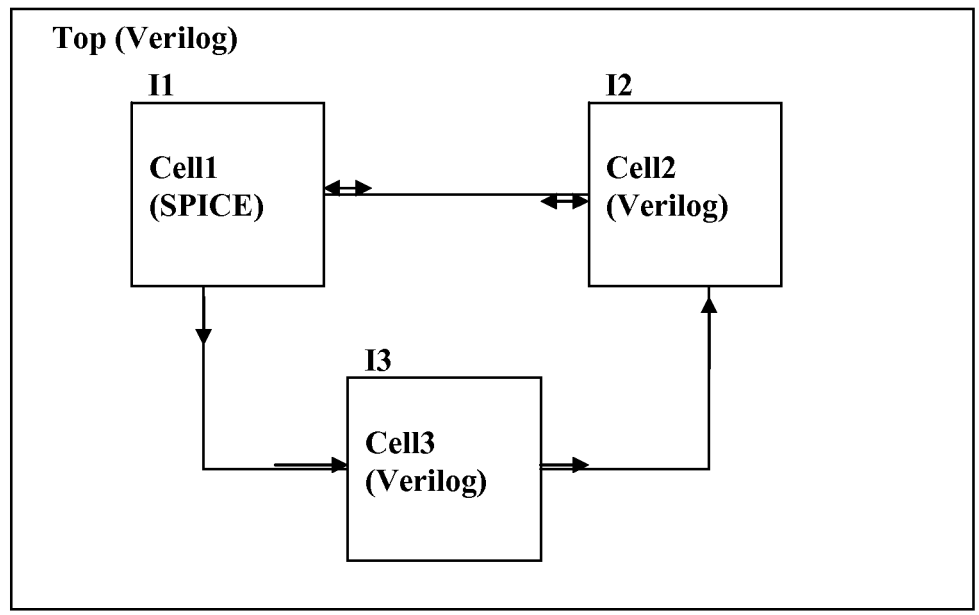

Examples of Changes to Circuit Design Connections Resulting from Methods Using Control Module Commands FIGS. 14A-14B are illustrative hierarchical circuit block level diagrams of an integrated circuit design that is converted from being purely digital (FIG. 14A) to being a mixed signal design that contains both analog and digital blocks (FIG. 14B). In FIGS. 14A-14B, the top-level design unit to be simulated is called 'top'. It includes three instances: instance I1 of cell 'cell1'; instance I2 of cell 'cell2'; and instance I3 of cell 'cell3'. In this example all three blocks in FIG. 14A are represented in a digital high level design language HDL (e.g., Verilog). In FIG. 14 B, instance I1 of cell 'cell1' is reconfigured as an analog cell. In other words, an analog circuit design component has been associated with the block for instance I1 of cell 'cell1' in place of the digital version of instance I1 of cell 'cell1'.

Referring to the design in FIG. 14A, since all the blocks are in digital HDL, a user can verify this pure digital design using a software tool produced by Cadence Design Systems, Inc. using the 'irun' executable as follows:

irun*.v

The Irun executable is a Verilog-AMS (digital) simulator which is capable of simulating Verilog and Verilog-AMS languages. For details on Verilog please refer to the standard Verilog LRM.

FIG. 15 is an illustrative drawing of a computer system screen display showing a control block used to specify the analog circuit component (i.e., the sub-circuit) to be substituted in to instance I1 of cell 'cell1' in accordance with some embodiments of the invention.

The include statement specifies the SPICE file "cell.sp" that contains the SPICE version of 'cell1'. The 'portmap' card is used to generate a portbind file that matches the SPICE version of 'cell1' to its Verilog equivalent in 'cell1.v' in accordance with the process of FIGS. 11A-11C. The 'config' card is used to specify that 'cell1' should be configured as SPICE in accordance with the process of FIG. 12. The 'ie' card is used to specify that the mixed-signal design operates with the supply voltage of 1.8 v in accordance with the process of FIGS. 13A-13B.

Referring to FIG. 14B, a user can verify this mixed signal design using a software tool produced by Cadence Design Systems, Inc. using the 'irun' executable as follows:

irun*.v*.scs

In accordance with some embodiments of the invention, the 'irun' simulator is enhanced so that it can read the SPICE formats (*.scs and *.sp files) directly on the command line and process SPICE formats accordingly, along with the digital/HDL source files. Thus, commands such as those shown in the control modules of FIGS. 1-5 and FIGS. 7-10A can irun simulator be read by using the modified irun executable. A benefit of such enhanced irun executable in some embodiments is that 'irun', which was a defacto digital/AMS simulator can now read analog/SPICE files directly on the command line, which is helpful to analog mixed-signal designers. Note that in the past, the irun executable did not support SPICE input, (since irun is a AMS simulator), and it did not have a direct way to provide SPICE file as an input.

FIGS. 16A-16B are illustrative block level diagrams of a digital version (FIG. 16A) and an analog version (FIG. 16B) of the same example cell. In this example, the example cell is named 'cell1'.

The following Table 6 sets forth a Verilog specification of the digital circuit design component associated with the digital version of cell1.

TABLE 6

| Verilog - cell1.v |
|---|
| module cell1(a, b,c);<br>input [0:1] a;<br>input [0:1] b;<br>output [0:1] c;<br>..... <some Verilog code describing the digital hardware><br>endmodule |

The following Table 7 sets forth a spice specification of the analog circuit design component associated with the digital version of cell1.

TABLE 7

| SPICE - cell1.scs |
|---|
| subckt cell1 a_0 a_1 b_0 b_1 c_0 c_1<br>... <some SPICE code describing the analog circuit><br>endsubckt |

FIG. 17 is an illustrative drawing of a computer system screen display showing a control block containing a portbind file that specifies a portbind file parameter that specifies a correspondence between the digital and analog versions of cell1 in FIGS. 16A-16B for use in portbind generation in accordance with the process of FIGS. 11A-11C in accordance with some embodiments of the invention.

FIG. 18 is an illustrative block level diagram showing connectivity mapping between the analog (e.g., SPICE) and digital (e.g., Verilog) versions of the example cell of FIGS. 16A-16B using the portbind file of FIG. 17 in accordance with some embodiments of the invention. The example in FIG. 18 is relatively simple mapping of scalar nets in SPICE to vectors in Verilog. It will be appreciated that all nets in SPICE are scalar since there is no concept of a 'bus' in SPICE. Thus, it will be appreciated that the portbind file is used during simulation to in essence map digital terminals of the digital version of cell1 to analog terminals (e.g., ports) of the analog version of cell1. In this manner, during a simulation run, information can be propagated (mapped) from a terminal of a digital block to a terminal of an analog block and vice versa. For example, bit a[0] of input signal on digital bus line 'a[0:1]' is mapped to analog port a_0. Moreover, for example, an analog output signal on analog port 'c_1' is mapped to digital terminal 'c[1]'. Furthermore, for example, a bit b[0] of digital bus 'b' is mapped to analog port 'b_0'.

Thus, the portbind interface between the Verilog and SPICE can easily be modified, which is helpful in debugging and editing the design.

The tool uses the algorithm in FIGS. 11A-11C to map the digital and SPICE versions of the same block in a portbind file. This information is used subsequently by the simulator to stitch or bind the SPICE block with the Verilog blocks. For example, this is how the SPICE block is connected to Verilog blocks shown in FIG. 14B.

The following Table 8 sets forth a different Verilog specification of the digital circuit design component associated with the digital version of cell1 in which the direction of bus 'b' is descending.

TABLE 8

Verilog - cell1.v module cell1(a, b,c);
input [0:1] a;
input [1:0] b;
output [0:1] c;
..... <some Verilog code describing the digital hardware>
endmodule FIG. 19 is an illustrative block level diagram of a digital version representing the circuit design having a descending bus 'b'. Example code for digital 'cell1' of FIG. 19 is presented in Table 8.

FIG. 20 is an illustrative drawing of a computer system screen display showing a control block containing a portmap command that specifies a file parameter that directly specifies a correspondence between the digital and analog versions of cell1 in FIG. 19 and FIG. 16B for use in portbind generation in accordance with the process of FIGS. 11A-11C in accordance with some embodiments of the invention.

FIG. 21 is an illustrative block level diagram showing connectivity mapping between the analog (e.g., SPICE) and digital (e.g., Verilog) versions of the example cell of FIG. 19 and FIG. 16B using the portmap command of FIG. 20 in accordance with some embodiments of the invention. Note that the port range directions specified in the Verilog code of Table 8 are preserved from the respective source files, i.e., {b_0, b_1} is obtained from the SPICE file, while b[1:0] is obtained from the Verilog reference file. Thus, for example, a logic level '0' signal input on digital bus 'b' is connected to analog port 'b_1.

Figures 22, 23:
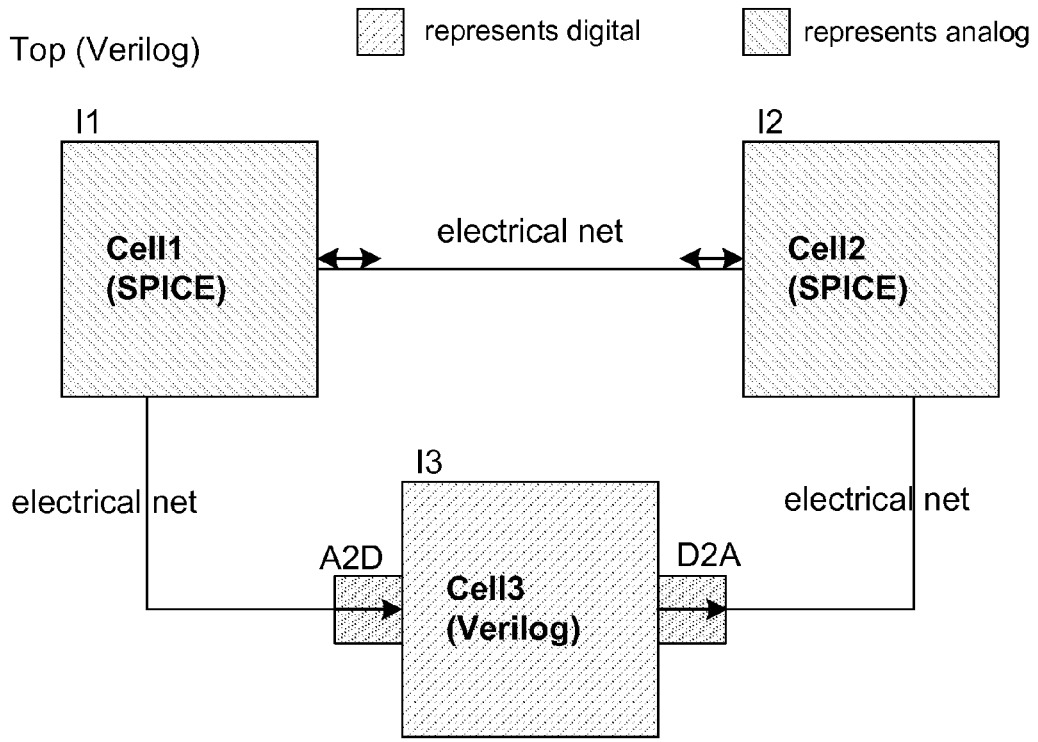
FIG. 22 is an illustrative hierarchical block level diagram of an integrated circuit design that includes two analog instances and a digital instance.
FIG. 23 is an illustrative drawing of a computer system screen display showing a control block containing a control block to specify processing of the analog instances of FIG. 22.

Example of Automatic Generation of Interface Elements in a Circuit Design Resulting from Methods Using Control Module Commands FIG. 22 is an illustrative hierarchical block level diagram of an integrated circuit design that includes two analog instances and a digital instance. The FIG. 22 design includes: an analog version of instance I1 of cell 'cell1'; an analog version of instance I2 of cell 'cell2'; and a digital version of instance I3 of cell 'cell3'. In addition, the design includes interface element A2D (analog-to-digital) between I1 and I3 and includes interface element D2A (digital-to-analog) between I3 and I2.

FIG. 23 is an illustrative drawing of a computer system screen display showing a control block containing a control block to specify processing of the analog instances of FIG. 22. The control block of FIG. 23 includes portmap commands that specify reffile parameters for the two analog cells of FIG. 22. It also includes a config command that the two analog cells are to be configured for SPICE. Moreover it includes an ie command that specifies that vsup is 1.8.

More particularly, the circuit design has two SPICE blocks—'cell1' and 'cell2'. The Verilog reference file can be used to specify the port interface information for both the blocks. The top-level instance 'top' and all the blocks within this instance operate under 1.8 v supply. A portbind file is generated in accordance with the process of FIGS. 11A-11C for each of the SPICE blocks. An intermediate config database is generated to manage information about the SPICE blocks in accordance with the process of FIG. 12. A Verilog-AMS interface element file is generated in computer readable storage media according to the process of FIGS. 13A-13B. The generated Verilog-AMS file is used during design simulation to apply the Verilog-AMS language semantics like discipline resolution and automatic insertion of interface elements such as the A2D and D2A interface elements of FIG. 22 to prepare the design for simulation.

For example, the ie command in the example display of FIG. 23 is, ie vsup=1.8 inst=top In accordance with some embodiments of the invention, the generated Verilog-AMS files produced through the process of FIGS. 13A-13B are shown in Table 9. It will be appreciated that in some embodiments of the invention, the contents of the generated file (e.g., parameters and rules) may be retrieved from a template stored in computer readable storage media.

TABLE 9

'include "disciplines.vams"
discipline ddiscrete_1_8
domain discrete
enddiscipline
'define Vsup1 1.8
'define Vthi1 1.20
'define Vtlo1 0.60
'define Tr1 0.2n
'define Rlo1 200.0
'define Rhi1 200.0
'define Rx1 40.0
'define Rz1 10.0M
'define Tx_del1 'Tr1*4.0
'define Vdelta1 'Vsup1/64.0
'define Vdelta_tol1 'Vdelta1/4.0
'define Tr_delta1 'Tr1/20.0
connectrules ddiscrete_1_8_cr;
connect L2E_2 #( .vsup('Vsup1), .tr('Tr1), .tf('Tr1),
    .rlo('Rlo1), .rhi('Rhi1), .rx('Rx1), .rz('Rz1) ) ddiscrete_1_8,
    electrical;
connect E2L_2 #(.vsup('Vsup1), .vthi('Vthi1), .vtlo('Vtlo1), .tr('Tr1),
    .txdel('Tx_del1) ) electrical, ddiscrete_1_8;
connect Bidir_2 #( .vsup('Vsup1), .vthi('Vthi1), .vtlo('Vtlo1), .tr('Tr1),
    .tf('Tr1), .rlo('Rlo1), .rhi('Rhi1), .rx('Rx1), .rz('Rz1),
    .txdel('Tx_del1) )
                ddiscrete_1_8, electrical;
connect E2R #(.vdelta('Vdelta1), .vtol('Vdelta_tol1), .ttol('Tr_delta1))
                electrical, ddiscrete_1_8;
connect R2E_2 #(.vsup('Vsup1), .vdelta('Vdelta1), .tr('Tr_delta1),
                .tf('Tr_delta1), .rout('Rlo1)) ddiscrete_1_8,
                electrical;
connect ER_bidir #(.vdelta('Vdelta1), .vtol('Vdelta_tol1),
    .ttol('Tr_delta1),
                .tr('Tr_delta1), .tf('Tr_delta1), .rout('Rlo1),
                    ddiscrete_1_8, electrical;
endconnectrules Note that 'discipline ddiscrete_1_8' is a new discipline declaration created by the computer tool that will cause the correct IE and parameters to be inserted across the digital to analog interface. So, for a supply voltage equal to 1.8, a unique discipline name is generated, which is used by the simulator. A list of parameters is set forth, and a set of connect rules that employ these parameters also is set forth. These parameters and connect rules are pre-defined. The use of the above ie command as shown in the illustrative display of FIG.

23, results in the automatic generation of the parameters and connect rules of Table 9. Thus a user can enter a simple ie command line statement to generate connect rules rather than have to encode them himself or herself. The connect rules can be used by the Verilog-AMS mixed signal simulator to generate the A2D and D2A interface elements of FIG. 22.

Example of Automatic Generation of Parameterized Interface Elements in a Circuit Design Resulting from Methods Using Control Module Commands FIG. 24 is an illustrative drawing of a computer system screen display showing an AMS control file listing a set of parameters including a global SPICE parameter, VDD, and also including a control block having an ie command that that includes the global parameter in accordance with some embodiments of the invention. It will be appreciated that changes of the value of the global parameter will influence behavior of all analog elements in the design, since it is global. A global parameter may be swept (varied) during simulation to assess circuit performance under different conditions represented by different values of such variable. The inclusion of the global parameter in the control module ie command results in generation of interface elements that are parameterized to be responsive to changes in the value of the global parameter just as other analog circuit elements are, resulting in more accurate simulation results.

Table 10 represents example connect rules that can be produced in response to the control module ie command of the display of FIG. 24.

TABLE 10 connectrules ie_1
connect E2L_ie_1 #(.tf(1n));
connect L2E_ie_1 #(.tf(1n));
endconnectrules Of course, E2L signifies Electrical to Logic, which corresponds to A2D in FIG. 22, and L2E signifies Logic to Electrical, which corresponds to D2A in FIG. 22. In the above example connect rules, the tf (fall time) parameter is set to a constant value specified in the tf parameter of the 'ie' card in FIG. 24. However, the vsup and tr parameters of the ie command are dependent on SPICE parameters set forth in the control file. Thus, in accordance with one aspect of the invention, special connect modules generated by the process of FIGS. 13A-13B such as the example connect rules set forth in Table 11.

TABLE 11 connectmodule E2L_ie_1 (el,cm);
input el;
output cm;
reg cm;
electrical el;
ddiscrete cm;
always @(cross(V(el) – $simparam("VDD")/2, 1))
  cm = 1;
always @(cross(V(el) – 2.5, –1))
  cm = 0;
endmodule
connectmodule L2E_ie_1 (cm,el);
input cm;
output el;
ddiscrete cm;

TABLE 11-continued electrical el;
analog
  V(el) <+ transition((cm == 1) ?
  $simparam("VDD") : 0.0,$simparam("trise")*0.01);
Endmodule In the example of Table 11, these connect modules are fully compliant Verilog-AMS where the '$simparam' Verilog-AMS system function is used to retrieve the value of the SPICE parameters VDD and trise in the digital and analog domain of the Verilog AMS module. This allows a interface elements to access the value of a SPICE parameter or parameter expression directly. Thus, the interface elements use the actual SPICE parameter values even as those values are swept, for example.

Referring again to the block diagram of FIG. 22, if the SPICE netlist and the interface elements all use the same voltage value based on the spice parameter VDD, then there is consistency between the SPICE, AMS and Digital for that voltage value. This results in more accurate simulation of the design. In this case, Cell1, Cell2 would be defined in the SPICE netlist and use VDD as the power supply value. Cell3 would be defined in Verilog and is connected to SPICE through an A2D (Analog to Digital interface element) and through a D2A (Digital to Analog interface element). The A2D is an instance of the connectmodule E2L_ie_1 and the D2A is an instance of the connectmodule L2E_ie_1. As E2L_ie_1, L2E_ie_1, are sensitive to VDD, the A2D and D2A will also behave in a way that is sensitive to VDD e.g., when VDD is 3.2, the D2A will convert a digital '1' into a voltage value of 3.2 volts and when VDD is 2.9, the D2A will convert a digital '1' into a voltage value of 2.9 volts in a simulation. Therefore, all elements in the mixed Verilog/SPICE simulation are using the exact same voltage value as would be expected in a physical circuit resulting in more accurate simulation of that circuit.

Computer System to Run Simulation

Figure 25:
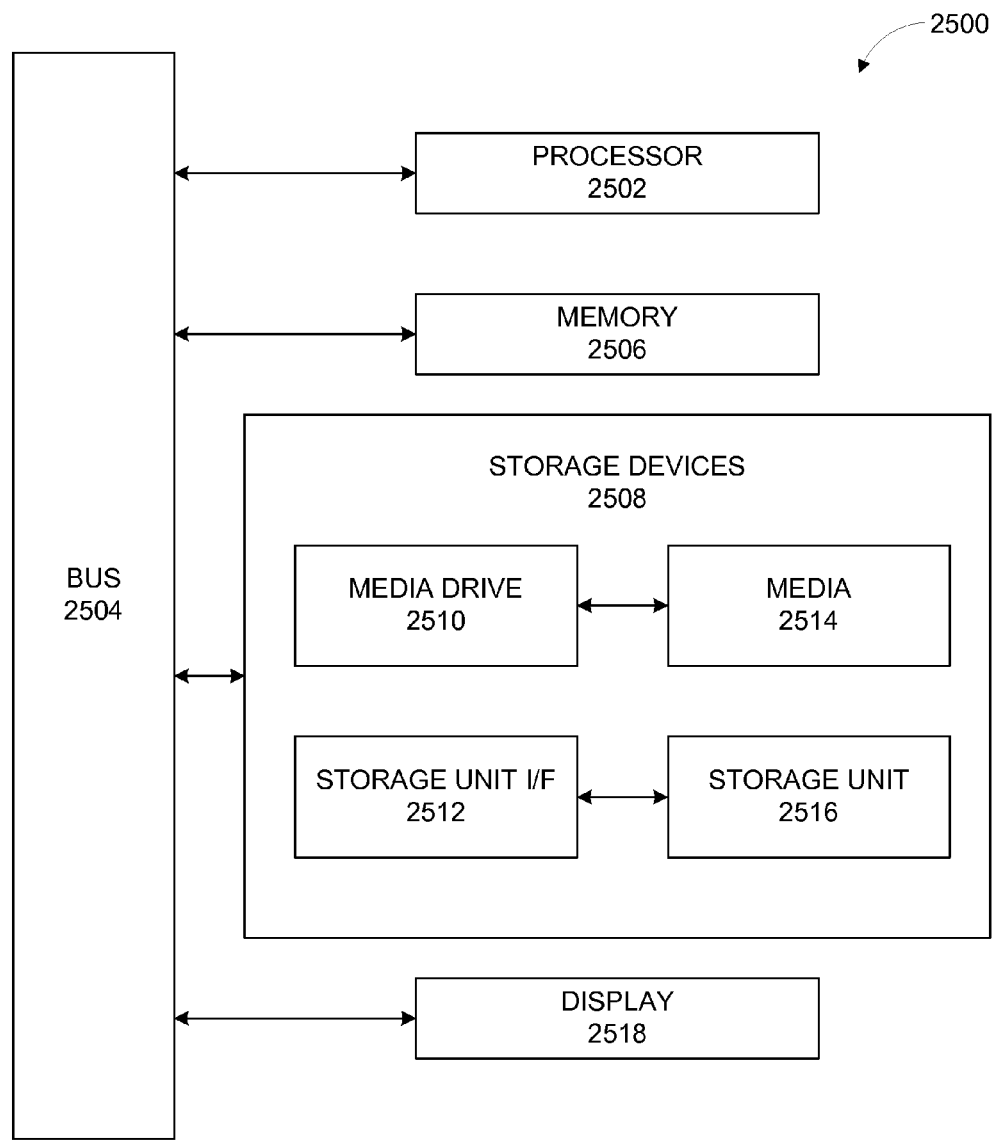
FIG. 25 is an illustrative block level diagram of a computer system that can be programmed to perform digital, analog and mixed-signal simulation of different blocks of an integrated circuit design in accordance with some embodiments.

FIG. 25 is an illustrative block level diagram of a computer system 2500 that can be programmed to perform digital, analog and mixed-signal simulation of different blocks of an integrated circuit design in accordance with some embodiments of the invention. Computer system 2500 can include one or more processors, such as a processor 2502. Processor 2502 can be implemented using a general or special purpose processing engine such as, for example, a microprocessor, controller or other control logic. In the example illustrated in FIG. 25 processor 2502 is connected to a bus 2504 or other communication medium.

Computing system 2500 also can include a main memory 2506, preferably random access memory (RAM) or other dynamic memory, for storing information and instructions, such as code corresponding to control blocks that can include portmap, config and ie commands, to be processed using processor 2502 programmed to perform the processes of FIGS. 11A-13B. Main memory 2506 also may be used for storing the programs of FIGS. 11A-13B and for storing port-bind information, configuration information and interconnect elements produced using those processes. Computer system 2500 can likewise include a read only memory ("ROM") or other static storage device coupled to bus 2504 for storing static information and instructions for processor system 2502. Moreover, the main memory 2506 and the persistent storage devices 2508 may store data such as simulation waveforms or design database or a computer program such as an integrated circuit design simulation process, for example.

The persistent storage devices 2508 may include, for example, a media drive 2510 and a storage interface 2512. The media drive 2510 can include a drive or other mechanism to support storage media 2514. For example, a hard disk drive, a floppy disk drive, a magnetic tape drive, an optical disk drive, a CD or DVD drive (R or RW), or other removable or fixed media drive. Storage media 2514, can include, for example, a hard disk, a floppy disk, magnetic tape, optical disk, a CD or DVD, or other fixed or removable medium that is read by and written to by media drive 2510. Information storage mechanism 2508 also may include a storage unit 2516 in communication with interface 2512.

The computer system 2500 also includes a user interface (UI) display unit 2518 that can be used to display user input information such as control module that includes portmap, config and ie commands.

In this document, the terms "computer program storage medium" and "computer readable medium" are used to generally refer to media such as, for example, memory 2506, storage devices 2508, a hard disk installed in hard disk drive 2510. These and other various forms of computer useable media may be involved in carrying one or more sequences of one or more instructions to processor 2502 for execution. Such instructions, generally referred to as "computer program code" (which may be grouped in the form of computer programs or other groupings), when executed, enable the computing system 2500 to perform features or functions of the present invention as discussed herein.

The foregoing description and drawings of preferred embodiments in accordance with the present invention are merely illustrative of the principles of the invention. It will be appreciated that the principles of the invention work with a wide variety of different syntax languages such as SPICE, Spectre, and Hspice syntax languages in the analog domain and in Verilog, Verilog-AMS, and VHDL languages in the digital domain, for example. Moreover, it is scalable and extensible to support other HDLs like, SystemVerilog, VerilogA, and SystemC, for example. Therefore, it will be understood that various modifications can be made to the embodiments by those skilled in the art without departing from the spirit and scope of the invention, which is defined in the appended claims.

The invention claimed is:

1. A method to create an integrated circuit that includes digital and analog components comprising:
   displaying on a computer system display, user input to the computer system that specifies configuration information for a circuit design block;
   wherein the circuit design block includes an instance path that includes a subcircuit instance on the path and that includes a leaf cell on the path; and
   wherein the configuration information specifies analog simulator use for a subcircuit instance on the path and that specifies a digital simulator use for a leaf cell on the path;
   saving the user specified configuration information in computer readable storage non-transitory media within a first file that also includes the circuit design block; and
   associating the circuit design block specified in the first file with an integrated circuit design stored in computer readable storage non-transitory medium;
   tagging the subcircuit instance and the leaf cell within the circuit design block based upon the specified configuration information to indicate that an analog simulator should be used to simulate the subcircuit instance and that a digital simulator should be used to simulate the leaf cell.

2. The method of claim 1,
   wherein the user input specifies configuration information that specifies that at least one design component is configured as a stub that should be ignored during simulation.

3. The method of claim 1 further including:
   running a simulation of the integrated circuit in a computer system;
   in the course of running the simulation of the circuit design block using an analog simulator to simulate the subcircuit instance and using a digital simulator to simulate the path leaf cell.

4. The method of claim 1,
   in the course of running the simulation of the circuit design block using an analog simulator to simulate the subcircuit instance and using a digital simulator to simulate the leaf cell;
   wherein tagging the subcircuit instance and the leaf cell within the circuit design block includes storing tagging results in a database; and
   wherein an analog simulator accesses the database to determine one or more components of the circuit design block to simulate using analog simulation and a digital simulator accesses the database to determine one or more components of the circuit design block to simulate using digital simulation.

5. A computer readable storage non-transitory medium encoded with program code to cause a computer system to perform a process that comprises:
   displaying on a computer system display, user input to the computer system that specifies configuration information for a circuit design block;
   wherein the circuit design block includes an instance path that includes a subcircuit instance on the path and that includes a leaf cell on the path; and
   wherein the configuration information specifies analog simulator use for a subcircuit instance on the path and that specifies a digital simulator use for a leaf cell on the path;
   saving the user specified configuration information in computer readable storage non-transitory media within a first file that also includes the circuit design block; and
   associating the circuit design block specified in the first file with an integrated circuit design stored in computer readable storage non-transitory medium;
   tagging the subcircuit instance and the leaf cell within the circuit design block based upon the specified configuration information to indicate that an analog simulator should be used to simulate the subcircuit instance and that a digital simulator should be used to simulate the leaf cell.

6. A computer system that includes computer readable storage non-transitory medium encoded with program code to cause the computer system to perform a process that comprises:
   displaying on a computer system display, user input to the computer system that specifies configuration information for a circuit design block;
   wherein the circuit design block includes an instance path that includes a subcircuit instance on the path and that includes a leaf cell on the path; and wherein the configuration information specifies analog simulator use for a subcircuit instance on the path and that specifies a digital simulator use for a leaf cell on the path;

saving the user specified configuration information in computer readable storage non-transitory media within a first file that also includes the circuit design block; and associating the circuit design block specified in the first file with an integrated circuit design stored in computer readable storage non-transitory medium;

tagging the subcircuit instance and the leaf cell within the circuit design block based upon the specified configuration information to indicate that an analog simulator should be used to simulate the subcircuit instance and that a digital simulator should be used to simulate the leaf cell.

* * * * *